United States Patent
Haynes et al.

(10) Patent No.: US 10,354,832 B2
(45) Date of Patent: Jul. 16, 2019

(54) MULTI-COLUMN SCANNING ELECTRON MICROSCOPY SYSTEM

(71) Applicant: KLA-Tencor Corporation, Milpitas, CA (US)

(72) Inventors: Robert Haynes, Pleasanton, CA (US); John Gerling, Livermore, CA (US); Aron Welk, Tracy, CA (US); Christopher Sears, Fremont, CA (US); Felipe Fuks, Milpitas, CA (US); Mehran Nasser-Ghodsi, Hamilton, MA (US); Tomas Plettner, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/616,749

(22) Filed: Jun. 7, 2017

(65) Prior Publication Data

US 2018/0358200 A1    Dec. 13, 2018

(51) Int. Cl.
*H01J 37/147* (2006.01)
*H01J 37/14* (2006.01)
(Continued)

(52) U.S. Cl.
CPC .......... *H01J 37/1474* (2013.01); *H01J 37/14* (2013.01); *H01J 37/1471* (2013.01); *H01J 37/18* (2013.01); *H01J 37/285* (2013.01)

(58) Field of Classification Search
CPC .. H01J 37/00; H01J 37/02; H01J 37/04; H01J 37/045; H01J 37/147; H01J 37/1472;
(Continued)

(56) References Cited

U.S. PATENT DOCUMENTS 6,426,501 B1 * 7/2002 Nakagawa .............. H01J 37/28
250/252.1
7,109,486 B1 * 9/2006 Spallas ................... H01J 37/04
250/306
(Continued)

FOREIGN PATENT DOCUMENTS

JP          2013125652 A      6/2013
JP    WO 2016063325 A1 *   4/2016 .............. H01J 37/18

OTHER PUBLICATIONS

U.S. Appl. No. 15/612,862, filed Jun. 2, 2017, Robert Haynes et al.
(Continued)

*Primary Examiner* — Jason L McCormack
(74) *Attorney, Agent, or Firm* — Suiter Swantz pc llo

(57) ABSTRACT

A multi-column scanning electron microscopy (SEM) system is disclosed. The SEM system includes a source assembly. The source assembly includes two or more electron beam sources configured to generate a plurality of electron beams. The source assembly also includes two or more sets of positioners configured to actuate the two or more electron beam sources. The SEM system also includes a column assembly. The column assembly includes a plurality of substrate arrays. The column assembly also includes two or more electron-optical columns formed by a set of column electron-optical elements bonded to the plurality of substrate arrays. The SEM system also includes a stage configured to secure a sample that at least one of emits or scatters electrons in response to the plurality of electron beams directed by the two or more electron-optical columns to the sample.

37 Claims, 16 Drawing Sheets

(51) Int. Cl.
*H01J 37/285* (2006.01)
*H01J 37/18* (2006.01)

(58) Field of Classification Search
CPC ........ H01J 37/1474; H01J 37/15; H01J 37/26;
H01J 37/261; H01J 37/28
USPC .......................................... 250/306, 307, 311
See application file for complete search history.

(56) References Cited

U.S. PATENT DOCUMENTS

| | | | |
|---|---|---|---|
| 8,106,358 B2 | 1/2012 | Spallas et al. | |
| 8,513,619 B1 | 8/2013 | Nasser-Ghodsi et al. | |
| 9,591,770 B2 | 3/2017 | Haynes et al. | |
| 9,741,532 B1* | 8/2017 | Bedell | H01J 37/28 |
| 2005/0214958 A1* | 9/2005 | Nakasuji | G01N 23/225 |
| | | | 438/14 |
| 2006/0071175 A1 | 4/2006 | Kim et al. | |
| 2006/0169910 A1* | 8/2006 | Frosien | B82Y 10/00 |
| | | | 250/396 ML |
| 2010/0019166 A1* | 1/2010 | Kim | B82Y 10/00 |
| | | | 250/396 R |
| 2012/0001069 A1* | 1/2012 | Kashihara | G02B 21/0004 |
| | | | 250/310 |
| 2013/0161511 A1* | 6/2013 | Karimata | H01J 37/261 |
| | | | 250/307 |
| 2013/0270435 A1* | 10/2013 | Sohda | H01J 37/153 |
| | | | 250/306 |
| 2014/0158886 A1 | 6/2014 | Takashi et al. | |
| 2017/0309437 A1* | 10/2017 | Agemura | H01J 37/18 |

OTHER PUBLICATIONS

C. Barry Carter and M. Grant Norton, Ceramic Materials: Science and Engineering, Second Edition, 2013, 4 pages, Springer, Springer Science + Business Media, New York.

International Search Report and Written Opinion dated Nov. 2, 2018 for PCT/US2018/036168.

* cited by examiner

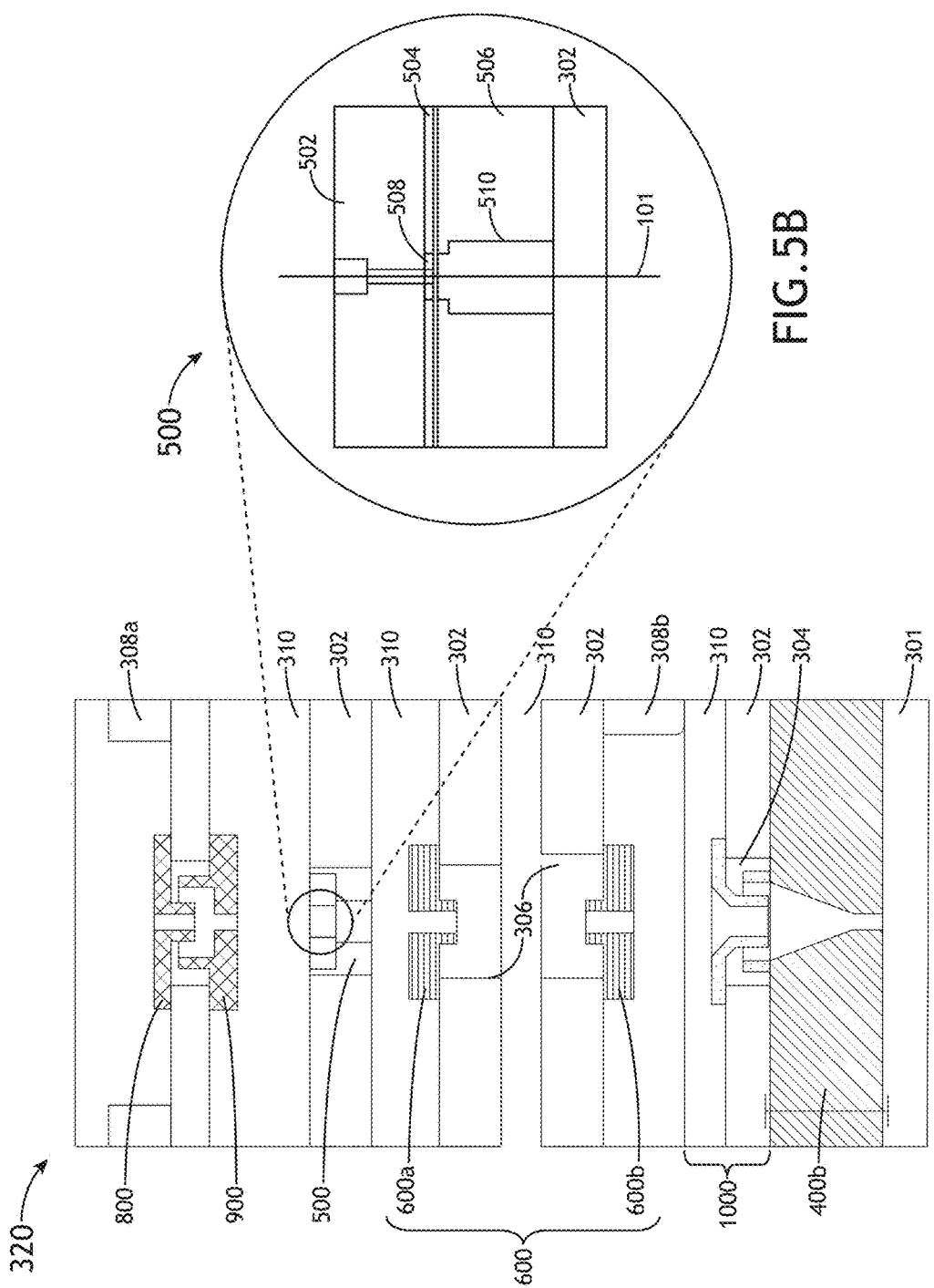

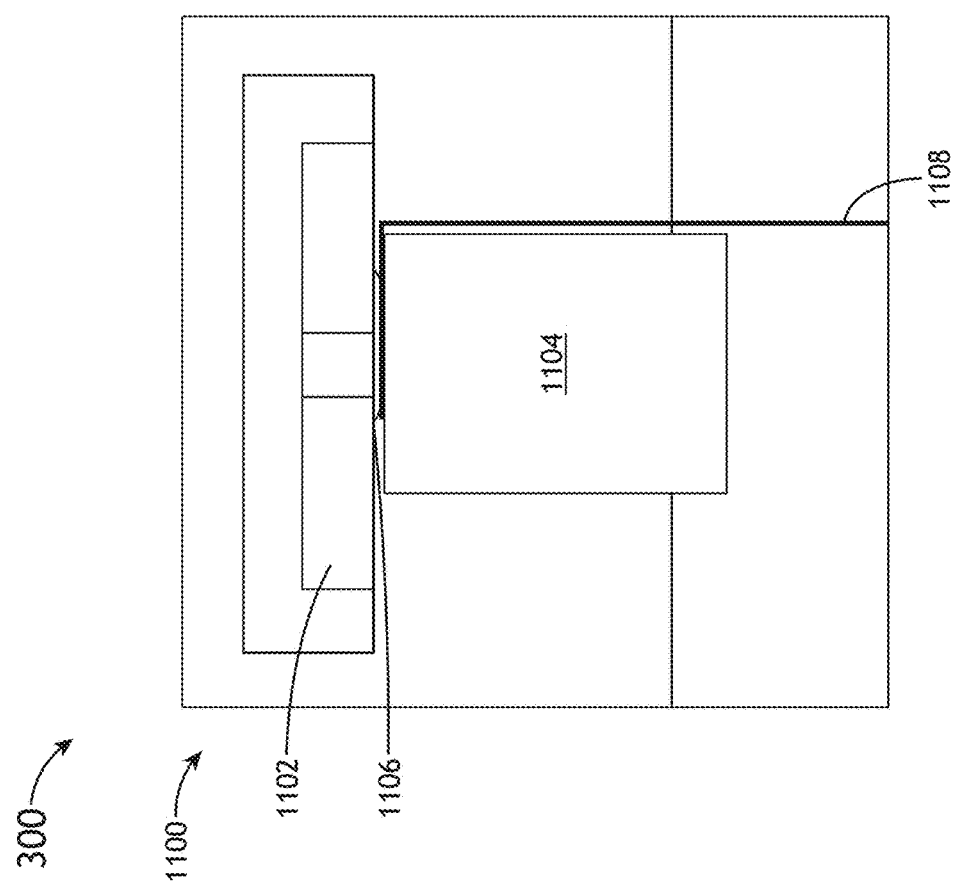

MULTI-COLUMN SCANNING ELECTRON MICROSCOPY SYSTEM

TECHNICAL FIELD

The present invention generally relates to wafer and photomask/reticle inspection and review and, more particularly, to a multi-column scanning electron microscopy system for use during wafer and photomask/reticle inspection and review.

BACKGROUND

The fabrication of semiconductor devices, such as logic and memory devices, typically includes processing a semiconductor device using a large number of semiconductor fabrication processes to form various features and multiple levels of the semiconductor devices. Some fabrication processes utilize photomasks/reticles to print features on a semiconductor device such as a wafer. As semiconductor device size becomes smaller and smaller, it becomes critical to develop enhanced inspection and review devices and procedures to increase the resolution, speed, and throughput of wafer and photomask/reticle inspection processes.

One inspection technology includes electron beam based inspection such as scanning electron microscopy (SEM). In some instances, scanning electron microscopy is performed by splitting a single electron beam into numerous beams and utilizing a single electron-optical column to individually tune and scan the numerous beams (e.g., a multi-beam SEM system). However, splitting a beam into an N number of lower-current beams traditionally reduces the resolution of the multi-beam SEM system, as the N number of beams are tuned on a global level and individual images cannot be optimized. Additionally, splitting a beam into an N number of beams results in needing more scans and averages to obtain an image, which reduces the speed and throughput of the multi-beam SEM system. Further, multi-beam SEM systems have scalability constraints, where issues such as field curvature and other transverse aberrations become harder to correct as the size of the multi-beam SEM systems increases. Further, multi-beam SEM systems have issues with crosstalk between electron detectors within the systems, which is difficult to reduce and/or otherwise control without reducing secondary electron collection efficiency. Reducing crosstalk requires a high extraction field and a high secondary electron beam kinetic energy.

In other instances, scanning electron microscopy is performed via secondary electron beam collection (e.g. a secondary electron (SE) imaging system). However, these SE imaging systems are traditionally relatively large in size, the size being necessary to support the high voltages required to limit the SE imaging system to manageable chromatic aberration contributions. Additionally, the secondary electron collection efficiency of the SE imaging systems is low compared to other SEM system architectures (e.g. multi-beam or multi-column SEM systems). Further, the current per imaging pixel is low, so the intrinsic collection/exposure time per imaging pixel must be increased to compensate for the low current. Further, an SE imaging system requires a high extraction field, similar to the multi-beam SEM system.

In other instances, scanning electron microscopy is performed via an SEM system which includes an increased number of electron-optical columns (e.g. a multi-column SEM system). Traditionally, these electron-optical columns are individual stacks of metal, ceramic rings, and electromagnets. These individual stacks are too large to be placed together with an ideal pitch for optimizing wafer or photomask/reticle scan speed, and cannot be miniaturized to allow for packing a significant number of electron-optical columns in a usable area, resulting in a limitation of the number of stacks in the multi-column SEM system (e.g. four stacks). Additionally, having individual stacks results in issues with electron-optical column matching, crosstalk between the columns, and errant charging. Further, condensing and focusing is achieved for each electron-optical column through electrostatic means, which requires either the use of high-voltage gradients or a limitation in the physical scale reduction of the electron-optical columns. Both the use of high-voltage gradients and limiting the physical scale reduction presents risks of arcing or micro-discharge noise.

Therefore, it would be advantageous to provide a system that cures the shortcomings described above.

SUMMARY

A multi-column scanning electron microscopy (SEM) system is disclosed, in accordance with one or more embodiments of the present disclosure. In one embodiment, the SEM system includes a source assembly. In another embodiment, the source assembly includes two or more electron beam sources configured to generate a plurality of electron beams. In another embodiment, a particular electron beam source of the two or more electron beam sources is configured to generate an electron beam of the plurality of electron beams. In another embodiment, the source assembly includes two or more sets of positioners coupled to the two or more electron beam sources. In another embodiment, at least some of the two or more sets of positioners are configured to actuate an electron beam source of the two or more electron beam sources. In another embodiment, the SEM system includes a column assembly. In another embodiment, the column assembly includes a plurality of substrate arrays. In another embodiment, the column assembly includes two or more electron-optical columns. In another embodiment, at least some of the two or more electron-optical columns are formed by a set of column electron-optical elements bonded to the plurality of substrate arrays. In another embodiment, the SEM system includes a stage configured to secure a sample. In another embodiment, at least some of the two or more electron-optical columns are configured to direct at least a portion of an electron beam of the plurality of electron beams to a surface of the sample. In another embodiment, the sample emits or scatters electrons in response to the at least a portion of an electron beam of the plurality of electron beams.

A substrate array is disclosed, in accordance with one or more embodiments of the present disclosure. In one embodiment, the substrate array includes a composite substrate formed from a plurality of substrate layers. In another embodiment, the composite substrate includes a plurality of holes. In another embodiment, the substrate array includes a plurality of electrical components embedded within the plurality of substrate layers. In another embodiment, the substrate array includes one or more metal layers coupled to at least one surface of the composite substrate. In another embodiment, the substrate array includes one or more column electron-optical elements. In another embodiment, at least some of the one or more column electron-optical elements form a portion of one or more electron-optical columns. In another embodiment, the one or more electron-optical columns comprise a column assembly of a multi-column scanning electron microscopy (SEM) system.

A method is disclosed, in accordance with one or more embodiments of the present disclosure. In one embodiment, the method may include, but is not limited to, forming a plurality of substrate arrays. In another embodiment, the method may include, but is not limited to, bonding one or more column electron-optical elements to at least some of the plurality of substrate arrays. In another embodiment, the method may include, but is not limited to, aligning the plurality of substrate arrays to form one or more electron-optical columns from the bonded one or more column electron-optical elements. In another embodiment, the one or more electron-optical columns comprise a column assembly for a multi-column scanning electron microscopy (SEM) system.

A multi-column scanning electron microscopy (SEM) system is disclosed, in accordance with one or more embodiments of the present disclosure. In one embodiment, the SEM system includes a source assembly. In another embodiment, the source assembly includes one or more electron beam sources configured to generate a plurality of electron beams. In another embodiment, the source assembly includes one or more sets of positioners configured to actuate the one or more electron beam sources. In another embodiment, the SEM system includes a column assembly. In another embodiment, the column assembly includes a plurality of substrate arrays. In another embodiment, the column assembly includes one or more electron-optical columns formed by a set of column electron-optical elements bonded to the plurality of substrate arrays. In another embodiment, the SEM system includes a stage configured to secure a sample. In another embodiment, the one or more electron-optical columns are configured to direct the plurality of electron beams to a surface of the sample. In another embodiment, the sample emits or scatters electrons in response to the directed at least a portion of the plurality of electron beams.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 5A illustrates a partial cross-section view of an electron-optical column for a multi-column SEM system, in accordance with one or more embodiments of the present disclosure.

FIG. 5B illustrates a cross-section view of a secondary electron detector assembly of an electron-optical column, in accordance with one or more embodiments of the present disclosure.

FIG. 11 illustrates a cross-section view of an electrical connection management assembly for a column assembly of a multi-column SEM system, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A-13, a multi-column scanning electron microscopy (SEM) system is described, in accordance with the present disclosure.

Embodiments of the present disclosure are directed to a multi-column SEM system including a source assembly and a column assembly. Additional embodiments of the present disclosure are directed to individualized electron beam sources within the source assembly. Additional embodiments of the present disclosure are directed to individualized electron-optical columns within the column assembly. Additional embodiments of the present disclosure are directed to electron-optical elements within the electron-optical columns.

Figure 1A:
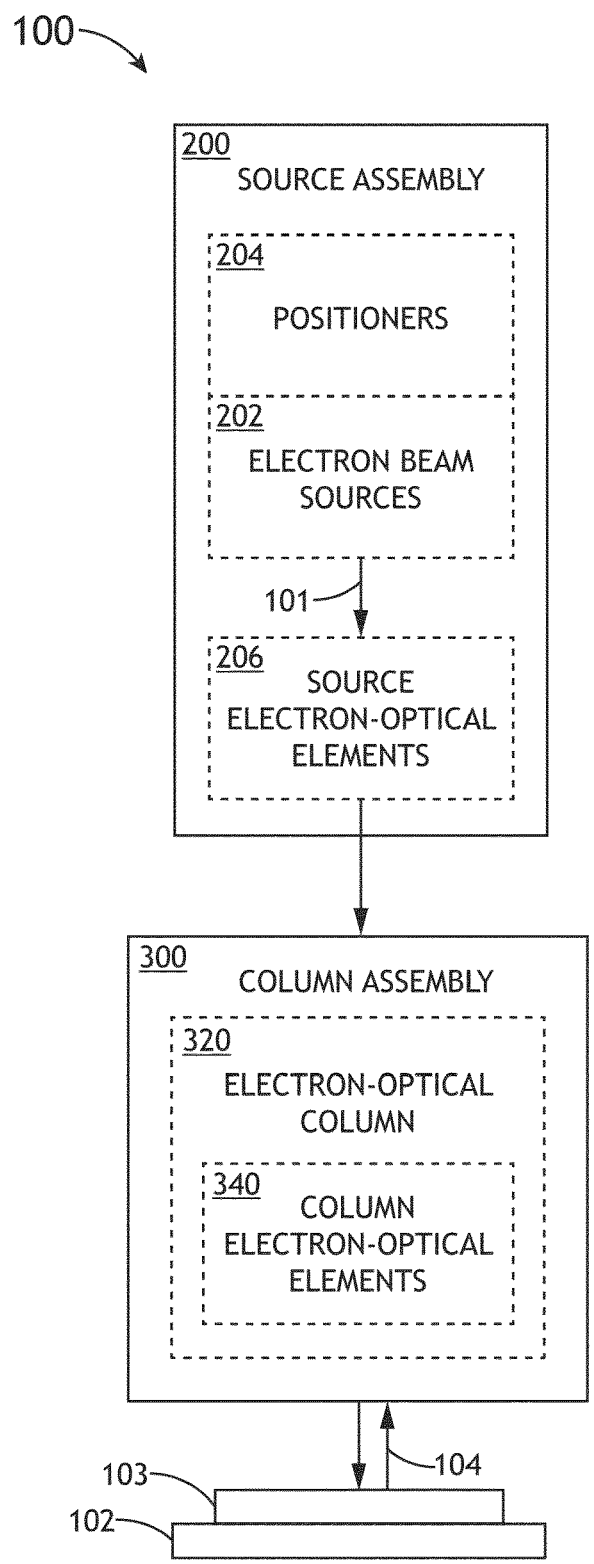
FIG. 1A is a simplified schematic view of a multi-column scanning electron microscopy (SEM) system equipped with a column assembly, in accordance with one or more embodiments of the present disclosure.
Figure 1B:
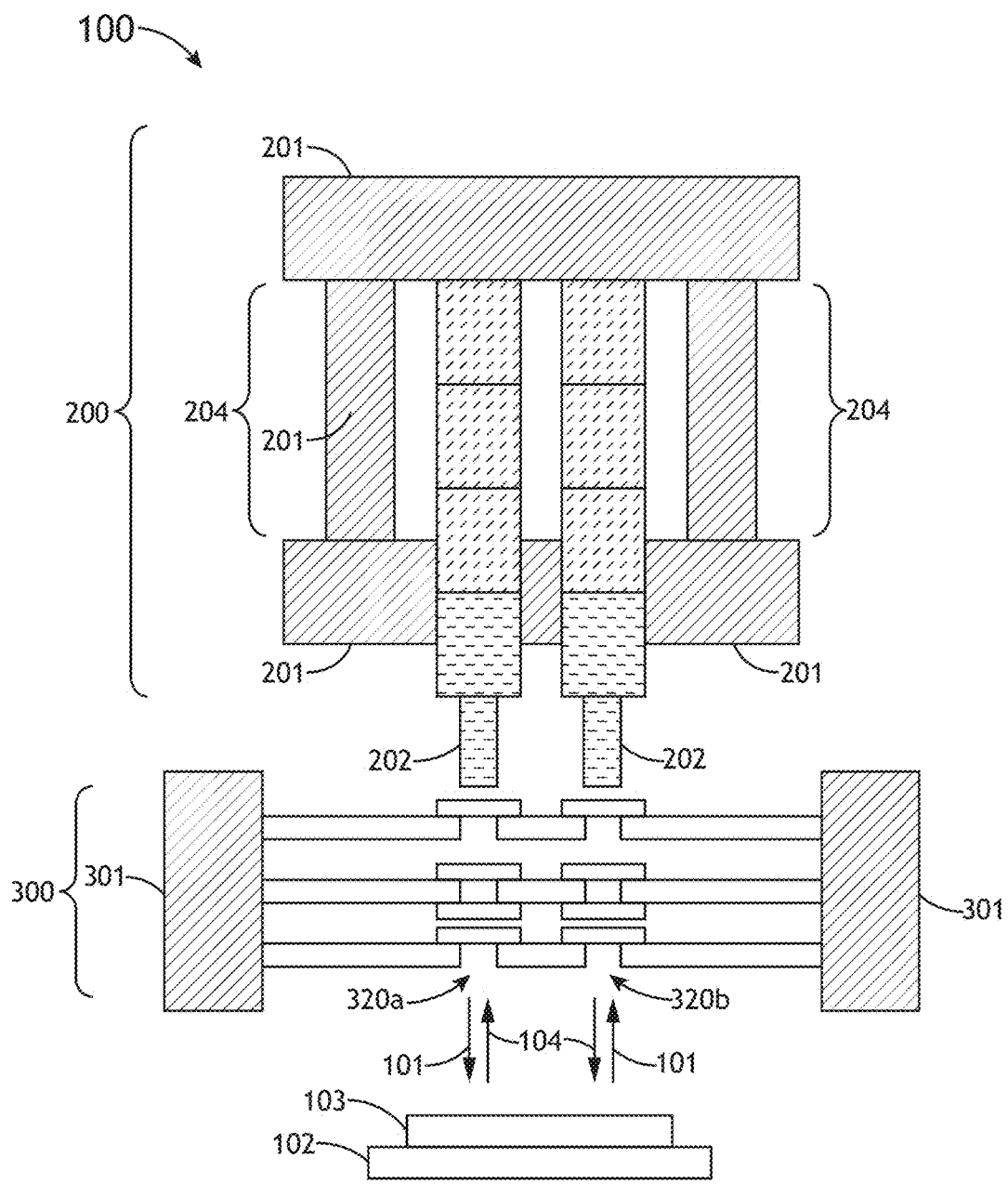
FIG. 1B illustrates a cross-section view of a multi-column SEM system, in accordance with one or more embodiments of the present disclosure.

FIGS. 1A and 1B illustrate an electron-optical system 100 for performing SEM imaging of a sample, in accordance with one or more embodiments of the present disclosure. In one embodiment, the electron-optical system 100 is a multi-column scanning electron microscopy (SEM) system. While the present disclosure largely focuses on an electron-optical arrangement associated with a multi-column SEM system, it is noted herein that this should not be interpreted as a limitation on the scope of the present disclosure but merely an illustration. It is additionally noted herein that the embodiments described throughout the present disclosure may be extended to any electron-optical system configuration. It is further noted herein that the embodiments described throughout the present disclosure may be extended to any optical system configuration for microscopy and/or imaging.

In one embodiment, the system 100 includes a source assembly 200. In another embodiment, the source assembly 200 includes one or more electron beam sources 202. In another embodiment, the one or more electron beam sources 202 generate one or more electron beams 101 and direct the electron beams 101 to one or more sets of source electron-optical elements 206. In another embodiment, the one or more electron beam sources 202 are coupled to one or more sets of positioners 204.

In another embodiment, the system 100 includes a column assembly 300 including one or more electron-optical columns 320. In another embodiment, the one or more electron-optical columns 320 include one or more sets of column electron-optical elements 340. In another embodiment, the one or more sets of source electron-optical elements 206 direct the one or more electron beams 101 through the column assembly 300.

In another embodiment, the system 100 includes a stage 102 configured to secure a sample 103. In another embodiment, the column assembly 300 directs the one or more electron beams 101 to a surface of the sample 103. In another embodiment, one or more secondary electrons 104 are emitted and/or scattered from the surface of the sample 103 in response to the one or more electron beams 101.

In another embodiment, the system 100 includes a controller (not shown). In one embodiment, the controller is communicatively coupled to one or more of components of system 100. For example, the controller may be communicatively coupled to the source assembly 200, components of the source assembly 200, the column assembly 300, the one or more electron-optical columns 320, components of the one or more electron-optical columns 320 (e.g. the one or more column electron-optical elements 340), and/or the stage 102. In this regard, the controller may direct any of the components of system 100 to carry out any one or more of the various functions described previously herein. For example, the controller may direct the one or more sets of positioners 204 coupled to the one or more electron beam sources 202 to translate the one or more electron beam sources 202 in one or more of an x-direction, a y-direction, and/or a z-direction to correct beam misalignment produced by any of the components of the source assembly 200, the components of the column assembly 200, the column assembly 300, the one or more electron-optical columns 320, components of the one or more electron-optical columns 320 (e.g. the one or more column electron-optical elements 340), and/or the stage 102.

In another embodiment, the controller includes one or more processors configured to execute program instructions suitable for causing the one or more processors to execute one or more steps described in the present disclosure. In one embodiment, the one or more processors of the controller may be in communication with a memory medium (e.g., a non-transitory storage medium) containing program instructions configured to cause the one or more processors of the controller to carry out various steps described throughout the present disclosure.

Figure 2:
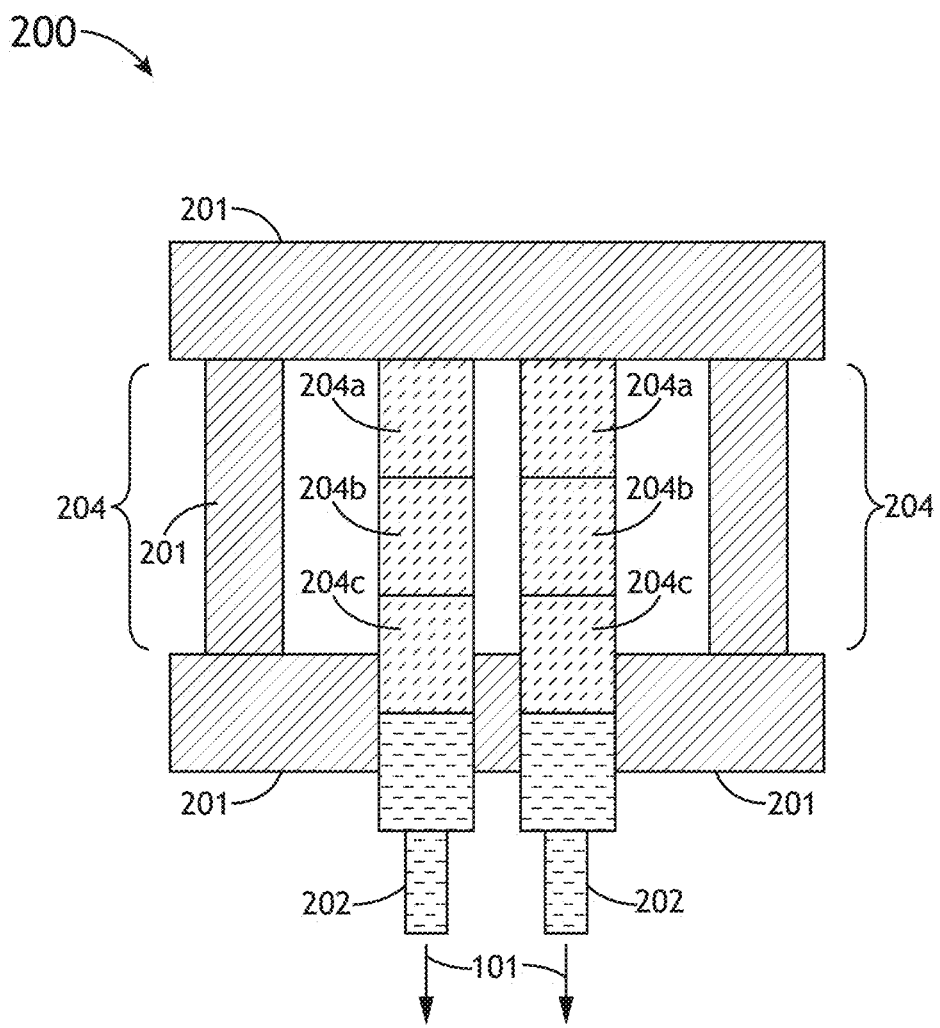
FIG. 2 illustrates a cross-section view of a source assembly for a multi-column SEM system, in accordance with one or more embodiments of the present disclosure.

FIG. 2 illustrates a cross-section view of the source assembly 200, in accordance with one or more embodiments of the present disclosure.

In one embodiment, the source assembly 200 includes a mounting frame 201 including one or more frame components. In another embodiment, the mounting frame 201 houses at least some of the one or more electron beam sources 202, the one or more sets of positioners 204 and/or the one or more sets of source electron-optical elements 206.

In one embodiment, the source assembly 200 includes the one or more electron beam sources 202. The one or more electron beam sources 202 may include any electron beam source known in the art suitable for generating the electron beams 101. For example, the one or more electron beam sources 202 may include multiple electron beam sources 202 for generating multiple electron beams 101, where each electron beam source 202 generates an electron beam 101. By way of another example, the one or more electron beam sources 202 may include a single electron beam source 202 that generates a single electron beam 101, where the single electron beam 101 is split into multiple electron beams 101 via one or more source electron-optical elements 206 (e.g., an aperture array).

In another embodiment, the electron beam sources 202 include one or more electron emitters. For example, the one or more emitters may include, but are not limited to, one or more field emission guns (FEGs). For instance, the one or more FEGs may include, but are not limited to, one or more Schottky-type emitters. It is noted the diameter of the Schottky-type emitters may be selected to fit within the pitch spacing of the electron-optical columns 320, while providing a sufficient amount of clearance for alignment of the electron-optical columns 320. Additionally, the one or more FEGs may include, but are not limited to, one or more carbon nanotube (CNT) emitters, one or more nanostructured carbon film emitters, or one or more Muller-type emitters. By way of another example, the one or more emitters may include, but are not limited to, one or more photocathode emitters. By way of another example, the one or more emitters may include, but are not limited to, one or more silicon emitters.

In one embodiment, the source assembly 200 includes one or more sets of positioners 204 configured to actuate the electron beam sources 202 in one or more directions. For example, the source assembly 200 may include a set of positioners 204 configured to actuate each of the multiple electron beam sources 202 in one or more directions. By way of another example, the source assembly 200 may include a single set of positioners 204 configured to actuate multiple electron beam sources 202 in one or more directions (e.g. configured to actuate the multiple electron beam sources 202 on a global scale). In another embodiment, the sets of positioners 204 are electrically coupled to the electron beam sources 202. In another embodiment, the sets of positioners 204 are mechanically coupled to the electron beam sources 202.

In another embodiment, each set of positioners 204 includes one or more positioners 204 configured to actuate an electron beam source 202 along one or more linear directions (e.g., an x-direction, a y-direction and/or a z-direction). For example, three positioners 204a, 204b, 204c may be configured to actuate an electron beam source 202. For instance, the three positioners may include, but are not limited to, a first positioner 204a configured to actuate the electron beam source 202 in an x-direction, a second positioner 204b configured to actuate the electron beam source 202 in a y-direction, and a third positioner 204c configured to actuate the electron beam source 202 in a z-direction. It is noted herein that the stacking order of positioners 204a, 204b, 204c is provided purely for illustration, and is not to be understood as limiting for purposes of the present disclosure.

In another embodiment, the one or more electron beam sources 202 include ceramic standoffs, where the ceramic standoffs electrically and thermally isolate the one or more electron beam sources 202 from at least the respective sets of positioners 204, the mounting frame 201, and the surrounding structures of the system 100.

In one embodiment, the source assembly 200 includes one or more sets of source electron-optical elements 206. For example, the source assembly 200 may include a set of source electron-optical elements 206 for each of the multiple electron beams 101. The one or more sets of source electron-optical elements 206 includes any electron-optical element known in the art suitable for one or more of focusing, suppressing, extracting, and/or directing at least a portion of the electron beams 101 to the column assembly 300. For example, the source electron-optical elements 206 may include, but are not limited to, one or more electron-optical lenses (e.g. one or more magnetic condenser lenses and/or one or more magnetic focus lenses). By way of another example, the one or more electron beam sources 202 may include one or more extractors (or extractor electrodes). It is noted herein the one or more extractors may include any electron beam extractor configuration known in the art. For instance, at least a portion of the extractors may include planar extractors. Additionally, at least a portion of the extractors may include non-planar extractors. The use of planar and non-planar extractors in electron beam sources is generally described in U.S. Pat. No. 8,513,619, issued on Aug. 20, 2013, which is incorporated herein by reference in its entirety.

In another embodiment, the source assembly 200 does not include any source electron-optical elements 206. In this embodiment, the electron beams 101 are focused and/or directed by the one or more column electron-optical elements 340 positioned within each electron-optical column 320 of the column assembly 300. For example, the one or more column electron-optical elements 340 may include, but are not limited to, the one or more extractors described in detail previously herein. Therefore, the above description should not be interpreted as a limitation on the scope of the present disclosure but merely an illustration.

In one embodiment, components of the source assembly 200 are fabricated from materials (e.g. tungsten, titanium, alumina, zirconium oxide, and the like) which are compatible with ultra-high vacuum (UHV). The need for UHV—compatibility is described in detail further herein.

Figure 3:
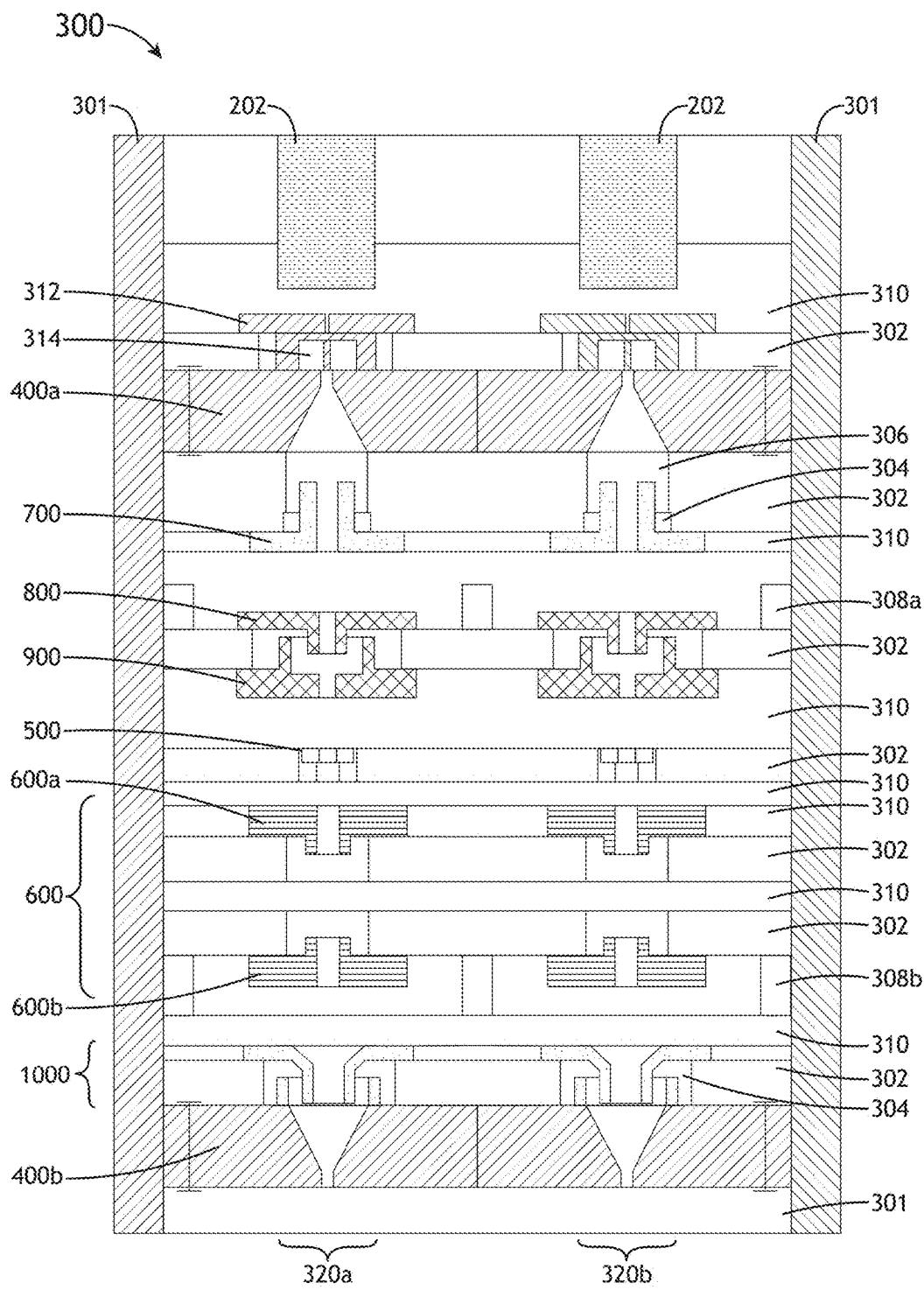
FIG. 3 illustrates a cross-section view of a column assembly for a multi-column SEM system, in accordance with one or more embodiments of the present disclosure.

FIG. 3 illustrates a cross-section view of the column assembly 300, in accordance with one or more embodiments of the present disclosure.

In one embodiment, the system 100 includes the column assembly 300. In another embodiment, the column assembly 300 includes a mounting frame 301 with one or more frame components.

In another embodiment, the column assembly 300 includes one or more substrate array assemblies. In another embodiment, the one or more substrate array assemblies include one or more substrate arrays 302. For example, the column assembly 300 may include seven substrate arrays. By way of another example, the one or more substrate arrays 302 may range from 100-mm square to 400-mm square in size. In another embodiment, the one or more substrate arrays 302 are arranged in a planar array format and secured in place within the column assembly 300 via the mounting frame 301.

In another embodiment, the substrate arrays 302 are fabricated from one or more substrate layers. In another embodiment, the substrate layers are fabricated from a co-fired ceramic. For example, the co-fired ceramic may include a high-temperature co-fired ceramic (HTCC), where the ceramic includes a tungsten ink printed onto an aluminum nitride (ALN) ceramic precast layer. In another embodiment, at least a portion of the substrate layers may be fabricated from a low-temperature co-fired ceramic (LTCC). However, it is noted here that an HTCC is preferable for its high thermal conductivity and reasonably low thermal expansion.

Forming the one or more substrate arrays 302 from an HTCC and/or an LTCC is generally described in U.S. Pat. No. 7,109,486, issued on Sep. 19, 2006, which is incorporated herein by reference in its entirety.

In another embodiment, the plurality of substrate layers is bonded together to form a composite layer via a bonding process. For example, the bonding process may include one or more of stacking, sintering and/or co-firing the plurality of layers to form a uniform and fully dense bulk ceramic with one or more embedded electrical components. In another embodiment, one or more surfaces of the composite layer (e.g., a top surface and/or a bottom surface) are coated with one or more metal layers via a metallization process following lapping and polishing of the composite layer. For example, the metallization process may include, but is not limited to, a thin-film metallization process or a thick-film metallization process. For instance, the thin film metallization process may include, but is not limited to, an application of a titanium/tungsten, palladium, and gold alloy coating. It is noted the application of a coating via a metallization process may reduce charging artifacts with the electron beams 101.

In one embodiment, the one or more embedded electrical components include one or more embedded electrical traces (e.g., one or more signal traces and/or one or more ground traces) that are embedded between at least some of the substrate layers prior to forming the composite layer. For example, the electrical traces may be fabricated from, but are not limited to, tungsten. In another embodiment, the one or more embedded electrical components include one or more electrical vias (e.g., one or more signal vias and/or one or more ground vias) that pass through at least some of the substrate layers. For example, the electrical vias may be fabricated from, but are not limited to, hermetic, solid-filled tungsten. It is noted herein that embedding the electrical traces allows for specific electrical specifications including, but not limited to, equal length differential broadside, edge coupled and/or symmetric strip lines. It is further noted herein that embedding the electrical traces allows for a nearly complete full coverage of the outer surface of the composite layer of the one or more substrate arrays 302 with metal to prevent errant charging.

In another embodiment, one or more element bonding pads (e.g. one or more ground bonding pads and one or more signal bonding pads) are coupled to the top surface and/or the bottom surface of the composite layer in the one or more metal layers. In another embodiment, a column electron-optical element is bonded to a particular ground bonding pad and a particular signal bonding pad coupled to at least one of the top surface or the bottom surface of the composite substrate. In another embodiment, the one or more ground bonding pads are electrically coupled to the one or more ground traces with the one or more ground vias. In another embodiment, the one or more signal bonding pads are electrically coupled to the one or more signal traces with the one or more signal vias.

In another embodiment, one or more connector contact pads (e.g., one or more ground contact pads and/or one or more signal contact pads) are coupled to the top surface and/or the bottom surface of the composite layer. For example, the one or more ground contact pads and the one or more signal contact pads may be coupled to an unshielded portion of the top surface and/or bottom surface of the composite layer. In another embodiment, the one or more ground contact pads are electrically coupled to the one or more ground bonding pads via the one or more ground traces. In another embodiment, the one or more signal contact pads are electrically coupled to the one or more signal bonding pads via the one or more signal traces. In this regard, the one or more ground contact pads and the one or more signal contact pads are electrically coupled to the one or more column electron-optical elements 340 bonded to a substrate array 302.

The structure and fabrication of a substrate array is described in further detail in application Ser. No. 15/612,862, filed on Jun. 2, 2017, which is incorporated herein in its entirety.

In one embodiment, one or more insulating portions of the one or more substrate arrays 302 within a line of sight of the one or more electron beams 101 are coated and/or otherwise blocked to prevent instability caused by errant charging of the electron beams 101. In another embodiment, as illustrated at least in FIGS. 3, 5A, and 7, the substrate arrays 302 have one or more film coatings 306 (e.g. a metallic thin-film coating, a metallic thick-film coating, or the like). In another embodiment, as illustrated at least in FIGS. 3, 5A, 6, and 7, the one or more insulating portions of the one or more substrate arrays 302 have an unprotected portion 304 (e.g. have a bare gap 304 that is not coated with a film coating 306 or protected by a shield 1020, described in detail further herein) to hide or shunt any charging artifacts from the one or more electron beams 101. In another embodiment, the one or more insulating portions of the one or more substrate arrays 302 include both a film coating 306 and an unprotected portion 304.

In another embodiment, the column assembly 300 includes one or more metal shielding layers 308. For example, the column assembly may include a metal shielding layer 308a and at least a second metal shielding layer 308b. By way of another example, wherein a substrate array assembly includes two or more substrate layers 302, a metal shielding layer 308 may be inserted between the two or more substrate layers 302. In another embodiment, the one or more metal shielding layers 308 separate one or more column electron-optical elements 340 bonded to a substrate array 302 to prevent electrical crosstalk between the one or more column electron-optical elements 340. For example, the one or more metal shielding layers 308 may separate, but are not limited to separating, one or more gun condenser lenses 800 bonded to a particular substrate array 302. By way of another example, the one or more metal shielding layers 308 may separate, but are not limited to separating, one or more lower beam deflectors 600b bonded to a particular substrate array 302.

In another embodiment, the column assembly 300 includes one or more layers 310 to space adjacent substrate arrays 302. For example, each of the layers 310 may be fabricated from different types of material and/or have different designs. By way of another example, at least some of the layers 310 may be fabricated from the same type of material and/or have the same design. By way of another example, at least some of the layers 310 may be blank space between adjacent substrate arrays 302 (e.g. is a layer of air).

In one embodiment, the column assembly 300 includes an electron-optical column 320 for each of the electron beams 101. For example, the column assembly 300 may include, but are not limited to, 2 to 60 electron-optical columns 320. For instance, the column assembly 300 may include a 4×4 array of 16 electron-optical columns 320. Additionally, the column assembly 300 may include a 5×6 array of 30 electron-optical columns 320.

In another embodiment, the electron-optical columns 320 are formed by bonding one or more sets of column electron-optical elements 340 to the one or more substrate arrays 302. In another embodiment, at least some of the one or more sets of column electron-optical elements 340 may include one or more types of column electron-optical elements 340. For example, at least some of the one or more sets of column electron-optical elements 340 are three-dimensional column electron-optical elements. By way of another example, at least some of the one or more sets of column electron-optical elements 340 may include, but are not limited to, one or more extractors 312, one or more electron beam-limiting apertures (BLA) 314, one or more magnetic lens assemblies 400 (e.g. one or more magnetic condenser lenses 400a and/or one or more magnetic focus lenses 400b), one or more detector assemblies 500, one or more beam deflectors 600 (e.g. one or more upper beam deflectors 600a and/or one or more lower beam deflectors 600b), one or more gun multipole beam deflectors 700, one or more gun condenser lenses 800, one or more anodes 900, and/or one or more dynamic focus lenses 1000.

In one embodiment, the one or more sets of column electron-optical elements 340 are bonded to the top surface and/or the bottom surface of the substrate arrays 302. For example, a set of column electron-optical elements 340 may be bonded to the top surface of a substrate array 302. By way of another example, a set of column electron-optical elements 340 may be bonded to the bottom surface of a substrate array 302. By way of another example, a first set of column electron-optical elements 340 may be bonded to the top surface of a substrate array 302, and a second set of column electron-optical elements 340 may be bonded to the bottom surface of the substrate array 302. In this regard, each substrate array 302 has electric circuitry for one or more sets of column electron-optical elements 340 bonded to a particular substrate array 302.

It is noted herein, however, that the column assembly 300 is not limited to the one or more sets of column electron-optical elements 340 including only one type of column electron-optical elements 340 (e.g. a set of column electron-optical elements 340 including one or more anodes 900, or the like), but that a set of column electron-optical elements 340 may include different types of column electron-optical elements 340 (e.g. a set of column electron-optical elements 340 including one or more anodes 900 and one or more gun condensers 800, or the like). Therefore, the above description should not be interpreted as a limitation on the scope of the present disclosure but merely an illustration.

Bonding a set of column-electron optical elements to a surface of a substrate array is described in further detail in application Ser. No. 15/612,862, filed on Jun. 2, 2017, which is incorporated previously herein in its entirety.

In another embodiment, electrostatic shielding is included between the column electron-optical elements 340 on the same substrate array 302. In another embodiment, one or more substrate arrays 302 (e.g., the substrate arrays 302 coupled to the magnetic lens assemblies 400) include provisions for countering fringing electric and/or magnetic fields, and additionally include provisions for optimizing electric and/or magnetic field uniformity.

In one embodiment, one or more of the types of column electron-optical elements 340 (e.g. the gun multipole beam deflectors 700, the gun condenser lenses 800, the anodes 900, the upper beam deflectors 600a, the lower beam deflectors 600b, or the dynamic focus lenses 1000) are fabricated from molybdenum. It is noted that column electron-optical elements 340 fabricated from molybdenum are non-magnetic, do not readily form an oxide in air, and can be clean-fired in a vacuum or an inert gas to remove contaminants prior to plating. In another embodiment, a thin plating (e.g. a gold plating) is bonded to the one or more types of column electron-optical elements 340 to facilitate solder reflow and adhesion.

In another embodiment, one or more of the sets of column electron-optical elements 340 (e.g. the one or more gun condenser lenses 800, the one or more anodes 900 and/or the one or more dynamic focus lenses 1000) are fully fabricated prior to being bonded to the substrate arrays 302. In another embodiment, one or more of the column electron-optical elements 340 (e.g. the one or more upper beam deflectors 600a, the one or more lower beam deflectors 600b, and/or the one or more gun multipole beam deflectors 700) are partially fabricated via a first set of fabrication process prior to bonding, and fully fabricated via a second set of fabrication processes post-bonding. For example, the first set of fabrication process may include, but are not limited to, a boring process to generate a hole, and/or a cutting process to generate one or more slots. By way of another example, the second set of fabrication processes may include, but are not limited to, a micro EDM process and/or a cutting process to extend the one or more slots and segment the one or more upper beam deflectors 600a, the one or more lower beam deflectors 600b, and the one or more gun multipole beam deflectors 700 into individual pole elements.

It is noted the method of partial fabrication is preferred for being non-contact, meaning it does not produce any mechanical stress which may potentially break one of many fabrication bonds. It is additionally noted herein the micro fabrication processes allow for pick-and-place positioning and bonding of the column electron-optical elements 340, creating the ability to design near-arbitrary three-dimensional shapes and also allow for the hiding of non-conductive regions from the electron-beam 101 line of sight. It is further noted herein the second set of fabrication processes (e.g. a micro EDM process, or the like) may be completed with dielectric oil and water only, and that the substrate arrays 302 may additionally be cleaned post-bonding and cutting.

Partial fabrication of an electron-optical element via a first set of fabrication process prior to bonding, and full fabrication of the electron-optical element via a second set of fabrication process post-bonding, is described in further detail in application Ser. No. 15/612,862, filed on Jun. 2, 2017, which is incorporated previously herein in its entirety.

It is noted herein that bonding one or more sets of column electron-optical elements 340 to the one or more substrate arrays 302 arranged in a planar array format provides a number of benefits. For example, making electrical connections between a large number of components is relatively easy with a multi-substrate layer design for a substrate array 302. By way of another example, aligning the one or more substrate arrays 302 is easier than aligning individual electron-optical columns 320. By way of another example, the use of a planar array format allows for the lateral evacuation of gas from the column assembly 300 (e.g., through airways 1308, as described in greater detail herein). However, it is noted herein that the one or more electron-optical columns 320 may instead be individually formed from one or more column electron-optical elements 340 and then positioned in the column assembly 300. Therefore, the above description should not be interpreted as a limitation on the scope of the present disclosure but merely an illustration.

In one embodiment, the one or more column electron-optical elements 340 are bonded to the one or more substrate arrays 302 so as to minimize electron-optical aberrations and/or voltage excursions with tuning. In another embodiment, the column electron-optical elements 340 are bonded while being aligned to a target feature on the substrate arrays 302. It is noted the accuracy of this alignment process is dependent on target feature quality and size.

In another embodiment, the one or more substrate arrays 302 are aligned with a translation fixture. For example, the translation fixture may be coupled to an optical metrology system, where the optical metrology system may then make measurements of components on a lower-stacked substrate array 302 for reference when aligning the components on an upper-stack substrate array 302. By way of another example, the translation fixture may be configured to actuate the upper-stack substrate array 302 in one or more of an x-direction and/or a y-direction. By way of another example, the translation fixture may rotate the upper-stack substrate array 302. In this regard, the adjustment of the upper-stack substrate array 302 may reduce the number of alignment errors via a least square best fit alignment of the column electron-optical elements 340 bonded to the upper-stack substrate array 302 relative to the column electron-optical elements 340 bonded to the lower-stack substrate array 302.

In one embodiment, the substrate arrays 302 and the column electron-optical elements 340 are prepared for bonding via an ultra-high vacuum (UHV) cleaning process. In another embodiment, the substrate arrays 302 and the column electron-optical elements 340 are prepared for bonding by applying a coating to the respective bonding surfaces. For example, the coating may include, but is not limited to, a titanium/tungsten, palladium, and gold alloy. For instance, the titanium/tungsten is an adhesion layer. Additionally, the gold protects the palladium from oxidation during the bonding process. By way of another example, the coating may include, but is not limited to, a titanium/tungsten, nickel and gold alloy. In another embodiment, the non-bonding surfaces are left blank to minimize the concern of gold contamination to semiconductor process wafers.

In one embodiment, at least a first portion of the one or more column electron-optical elements 340 is bonded to the one or more substrate arrays 302 via a soldering process. For example, the soldering process may include using a lead free, fluxless solder to allow for a desired volume control and easy application of preforms. For instance, a fluxless soldering process may allow for maintaining the level of cleanliness required for a UHV vacuum. By way of another example, the ceramic of the substrate arrays 302 may act as a dam to keep the solder within the bond interface. In another embodiment, the soldering process is completed in a nitrogen purge enclosure to prevent oxide formation.

In another embodiment, utilizing different solder alloys having different melting temperatures to bond one or more sets of column electron-optical elements 340 to the one or more substrate arrays 302 allows for multiple sets of column electron-optical elements 340 to be soldered to the same board without the risk of reflowing the previously soldered components.

For example, one or more sets of column electron-optical elements 340 (e.g. the one or more extractors 312, the one or more upper deflectors 600a, the one or more lower deflectors 600b, the one or more gun multipole beam deflectors 700, the one or more gun condensers 800, the one or more dynamic focus lenses 1000, or the like) may be soldered to the one or more substrate arrays 302 with a first solder type. For instance, the one or more sets of column electron-optical elements 340 may be soldered utilizing one or more separate, individual preforms, where the one or more preforms are the same type of preform. Additionally, the one or more sets of column electron-optical elements 340 may be soldered utilizing one or more separate, individual preforms, where at least some of the one or more preforms are a different type of preform from the remainder of the one or more preforms.

By way of another example, one or more sets of column electron-optical elements 340 (e.g. the one or more magnetic condensing lenses 400a, the one or more magnetic focus lenses 400b, the one or more anode 900, or the like) may be soldered to the one or more substrate arrays 302 with a second solder type.

By way of another example, one or more sets of column electron-optical elements 340 (e.g. the one or more BLA 314, or the like) may be soldered to the substrate arrays 302 with at least a third solder type.

In another embodiment, one or more of the first solder type, the second solder type, and/or the at least a third solder type have a low vapor pressures for planned vacuum levels and bake out temperatures.

In one embodiment, at least a second portion of the column electron-optical elements 340 (e.g. the one or more detector assemblies 500, the one or more anodes 900, or the like) are bonded to the substrate arrays 302 via an adhesion process. For example, the adhesion process may include joining via a low outgassing conductive epoxy. In another embodiment, the epoxy is applied with a fine point daub tool. In another embodiment, previously-applied epoxy to a first collection of the at least a second portion of the column electron-optical elements 340 is snapped cured by increasing the temperatures to the substrate array 302, while remaining column electron-optical elements 340 of the at least a second portion of the column electron-optical elements 340 are aligned. In another embodiment, the one or more substrate arrays 302 are cured in a vacuum furnace following completion of bonding the at least a second portion of the column electron-optical elements 340.

In one embodiment, the column assembly 300 includes one or more heat sources. For example, the one or more heat sources may include, but are not limited to, resistive heating for the one or more extractors 312 and the detector diode 502 of the one or more detector assemblies 500, and/or power dissipation by amplifier circuitry of the one or more detector assemblies 500. It is noted herein that large differences in thermal expansion may cause misalignments or solder joint failures without a way to dissipate the heat.

In one embodiment, a first portion of the one or more electron-optical columns 320 are individually tunable from at least a second portion of the one or more electron-optical columns 320. For example, a gun beam current may be individually controlled for each electron-optical column 320. By way of another example, condensing calibration may be individually controlled for each electron-optical column 320. In another embodiment, a first portion of the one or more sets of column electron-optical elements 340 are individually tunable from the at least a second portion of the one or more sets of electron-optical elements 320 on a same substrate array 302. In this regard, there may be essentially no electron beam or signals crosstalk between neighboring column electron-optical elements 340.

In another embodiment, the system 100 includes one or more resolution targets and/or electron-beam monitoring electron-optical elements at an image plane fixture. In another embodiment, the system 100 includes one or more setup and/or calibration algorithms designed to allow for full automaton of the system 100 (e.g., measuring and adjusting at least a portion of the one or more electron beams 101 simultaneously).

In another embodiment, the system 100 is operable with either all or a subset of the electron-optical columns 320 of the column assembly. In this regard, the system 100 may run one or more calibration and/or alignment review algorithms.

In another embodiment, each electron-optical column 320 is designed to target a maximum length in the cm range. In another embodiment, each electron-optical column 320 is tuned based on one or more of the electron-optical elements and/or beam trajectory of the emitted and/or scattered electrons 104 so as to maximize capture efficiency of the one or more detector assemblies 500 in the electron-optical columns 320. In this regard, a Wien filter may not be necessary within the electron-optical columns 320.

In another embodiment, the system 100 is operable with no crossover between the one or more electron beams 101. It is noted herein, that the one or more electron-optical columns 320 may be fabricated so as to allow for crossover of the one or more electron beams 101. Therefore, the above description should not be interpreted as a limitation on the scope of the present disclosure but merely an illustration.

In one embodiment, the one or more electron-optical columns 320 of the column assembly 300 direct at least a portion of the one or more electron beams 101 to the surface of the sample 103 secured on the stage 102. Referring again to FIG. 1A, in another embodiment the sample stage 102 is an actuatable stage. For example, the sample stage 102 may include, but is not limited to, one or more translational stages suitable for selectably translating the sample 103 along one or more linear directions (e.g., x-direction, y-direction and/or z-direction). By way of another example, the sample stage 102 may include, but is not limited to, one or more rotational stages suitable for selectively rotating the sample 103 along a rotational direction. By way of another example, the sample stage 102 may include, but is not limited to, a rotational stage and a translational stage suitable for selectably translating the sample along a linear direction and/or rotating the sample 102 along a rotational direction.

The sample 103 includes any sample suitable for inspection/review with electron-beam microscopy. In one embodiment, the sample includes a wafer. For example, the sample may include, but is not limited to, a semiconductor wafer. As used through the present disclosure, the term "wafer" refers to a substrate formed of a semiconductor and/or a non-semiconductor material. For instance, a semiconductor or semiconductor material may include, but is not limited to, monocrystalline silicon, gallium arsenide, and indium phosphide. In another embodiment, the sample includes a photomask. In another embodiment, the sample includes a reticle. In another embodiment, the sample 103 emits and/or scatters electrons 104 in response to the one or more electron beams 101.

Figure 4A:
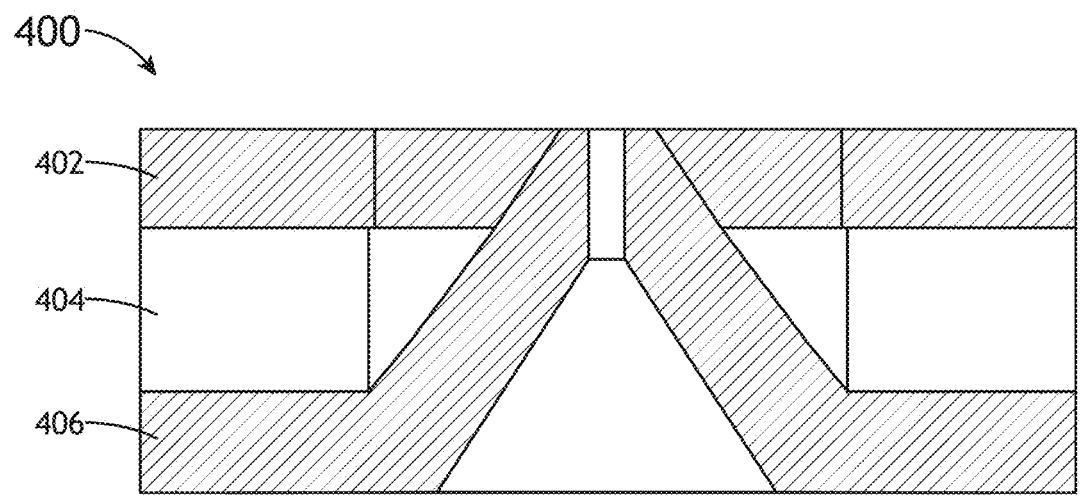
FIG. 4A illustrates a cross-section view of a magnetic lens assembly of an electron-optical column, in accordance with one or more embodiments of the present disclosure.
Figure 4B:
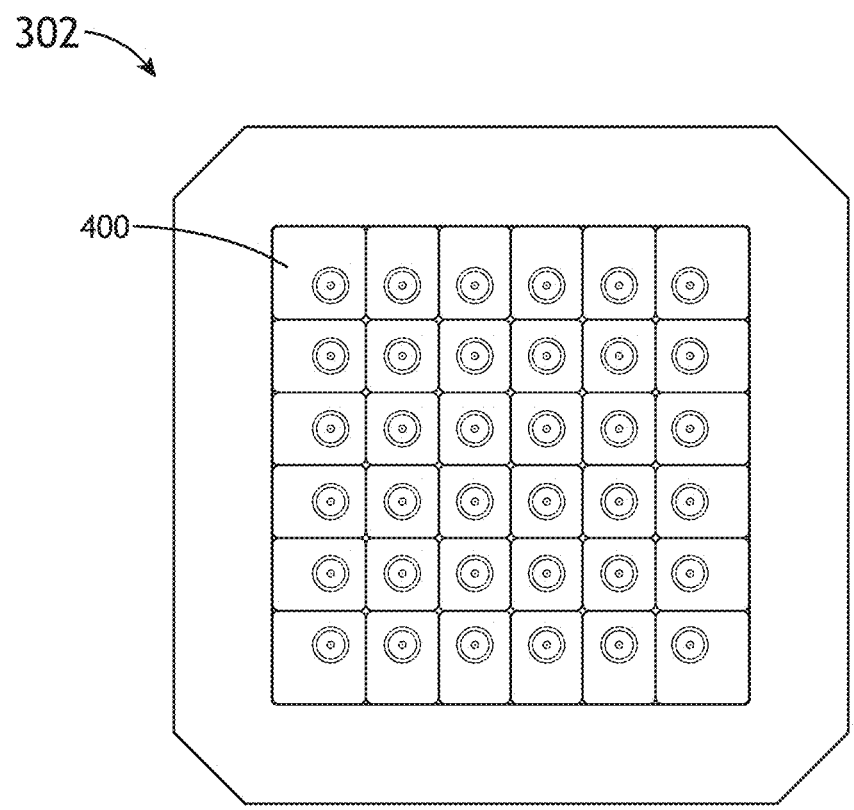
FIG. 4B illustrates a magnetic lens assembly of an electron-optical column, in accordance with one or more embodiments of the present disclosure.

FIGS. 4A and 4B illustrate a magnetic lens assembly 400 of an electron-optical column 320, in accordance with one or more embodiments of the present disclosure.

In one embodiment, the electron-optical column 320 includes a magnetic condensing lens 400a. For example, the magnetic condensing lens 400a may condense an electron beam 101 directed from an electron beam source 202 in the source assembly 200. In another embodiment, the electron-optical column 320 includes a magnetic focus lens 400b. For example, the magnetic focusing lens may focus an electron beam 101 at the sample plane of the sample 103.

In another embodiment, the magnetic lens assemblies 400 include a permanent magnet 404. For example, the permanent magnet 404 may be, but is not limited to, a samarium cobalt permanent magnet. It is noted herein that samarium cobalt has a relatively high curie temperature. In this regard, a samarium cobalt permanent magnet may be baked at higher temperatures than other magnet materials without risk of losing magnet strength. In another embodiment, the permanent magnet 404 is between magnetic pole pieces 402, 406.

In another embodiment, the magnetic lens assemblies 400 include a portion for an electron beam 101 to pass through. For example, the portion may include a cylindrical-shaped section with a first diameter and a conical-shaped section with the first diameter at one end (e.g. a small cone diameter) and a second diameter at a second end (e.g. a large cone diameter). By way of another example, the portion may include a cylindrical-shaped section.

In another embodiment, as illustrated in FIG. 4B, one or more magnetic lens assemblies 400 are bonded to a substrate array 302 with a gap between adjacent magnetic lens assemblies 400. It is noted herein this gap spacing may shunt the magnetic field at the outer edge of the magnetic lens assemblies 400. In another embodiment, one or more perimeter magnetic lens assemblies 400 bonded to the substrate array 302 may be symmetric in design and have a small non-uniformity. By way of another example, the one or more perimeter magnetic lens assemblies 400 may be non-symmetric in design to optimize uniformity.

In another embodiment, one or more of the permanent magnet 404 and the pole pieces 402, 406 are sputter coated. For example, the sputter coating may be, but is not limited to, a titanium/tungsten, palladium, and gold alloy. In another embodiment, the permanent magnet 404 and the pole pieces 402, 406 parts are bonded using solder in a vacuum furnace with a special fixture designed to apply constant pressure, which forces the permanent magnet 404 and the pole pieces 402, 406 together as the solder reflows.

In another embodiment, one or more critical features of the pole pieces 402, 406 are partially-fabricated prior to being bonded to the permanent magnet 404. For example, leaving only a small amount of material for removal during a post-bonding fabrication process may minimize mechanical stress on the pole pieces 402, 406, which allows for matched bonding to achieve pole to pole concentricity tolerances.

In another embodiment, the one or more permanent magnet assemblies 400 are wire EDM cut and lapped to achieve critical, tight thickness tolerance requirements. For example, the wire EDM cut may remove a bulk of unwanted material from the backside of the one or more permanent magnet assemblies 400. By way of another example, the finish lapping process may achieve a critical backside material thickness of the one or more permanent magnet assemblies 400 within the allowable tolerance. In another embodiment, the one or more permanent magnet assemblies 400 are flipped over and lapped on the topside to achieve an overall thickness. It is noted herein that a plate may be attached to the backside of the one or more permanent magnet assemblies 400 for protection if double-side lapping is used.

In another embodiment, the finished one or more magnetic lens assemblies 400 are cleaned, with one or more bonding surfaces plated and/or sputter coated for bonding to the substrate arrays 302. For example, the bonding surfaces may be plated or sputter coated with, but are not limited to being plated with, a gold coating.

In another embodiment, the finished one or more magnetic lens assemblies 400 are bonded to one or more substrate arrays 302. In another embodiment, the finished one or more magnetic lens assemblies 400 are magnetized after being bonded to the one or more substrate arrays 302. For example, the one or more substrate arrays 302 may be installed in a clean chamber during the magnetization process. By way of another example, the clean chamber and the one or more substrate arrays 302 may be placed into an electro-magnet and charged multiple times until saturation of the finished one or more magnetic lens assemblies 400 has been achieved.

FIGS. 5A and 5B illustrate an electron detector assembly 500 of an electron-optical column 320, in accordance with one or more embodiments of the present disclosure.

In one embodiment, the detector assembly 500 includes a detector diode 502. In another embodiment, the diode 502 includes a 20 micron diameter aperture 508 at a detector diode surface 504 for the electron beams 101 to pass through. In another embodiment, the diode 502 includes a dead area and an active area on the sample side of the diode 502, where the active area is configured to collect secondary and/or backscattered electrons 104 from the image plane of the sample 103.

In another embodiment, the diode 502 is bonded to a substrate array 302 via a detector shield 506. For example, the detector shield 506 may be designed to keep the dielectric ring around the dead area of the diode 502 from charging. In another embodiment, the detector shield 506 is fabricated from molybdenum. In another embodiment, the detector shield 506 includes an aperture with a diameter larger than the diameter of the aperture 508 at the surface of the diode 502 to prevent cropping of the electron beam 101.

In another embodiment, a majority of the material covering the active area of the diode 502 is removed, exposing a pie-shaped segment of the active area.

In another embodiment, the detector shield 506 includes one or more top pads and/or one or more bottom pads on a top surface and a bottom surface of the detector shield 506. In another embodiment, the one or more bottom pads bond to matching spots on a substrate array 302. In another embodiment, the one or more top pads bond to matching spots on the diode 502. It is noted herein the one or more top pads and/or the one or more bottom pads may prevent the detector shield 506 from shorting to the grounded portion of the substrate array 302 and/or shorting to another active region of the electron detector assembly 500. In another embodiment, the one or more top pads and/or the one or more bottom pads include a temporary tie bar connected to the cathode of the detector shield 506. For example, the cathode of the detector shield 506 may be isolated from the remaining part of the detector assembly 500 that is electrically coupled to anode voltage when the tie bar is removed.

In another embodiment, a center hub 510 of the detector shield 506 is configured to minimize the gap between a metal ring around a hole in the detector assembly 500 and a metal shield. In another embodiment, a small undercut is fabricated on the outer perimeter of the center hub 510 of the detector shield 506, which overlaps the insulator and active region of the detector assembly 500 without allowing them to short out.

In another embodiment, the detector shield 506 is fabricated from molybdenum via a fabrication process. For example, the fabrication process may include, but is not limited to, chemical etching, laser machining, a micro and traditional EDM process, or micro machining.

In another embodiment, the detector assembly 500 is electrically coupled to detector circuitry within the substrate array 302. For example, the detector circuitry to the detector assembly 500 may include one or more of three amplifiers, one or more surface mount resistors, one or more capacitors, and/or one or more temperature sensors. For instance, the three amplifiers may be epoxy bonded to the substrate array 302 and electrically coupled to the bonding pads on the substrate array 302 via wire bonds. Additionally, the surface mount components and several temperature sensors may be reflow soldered to the substrate array 302 via lead-free solder paste.

Figure 6:
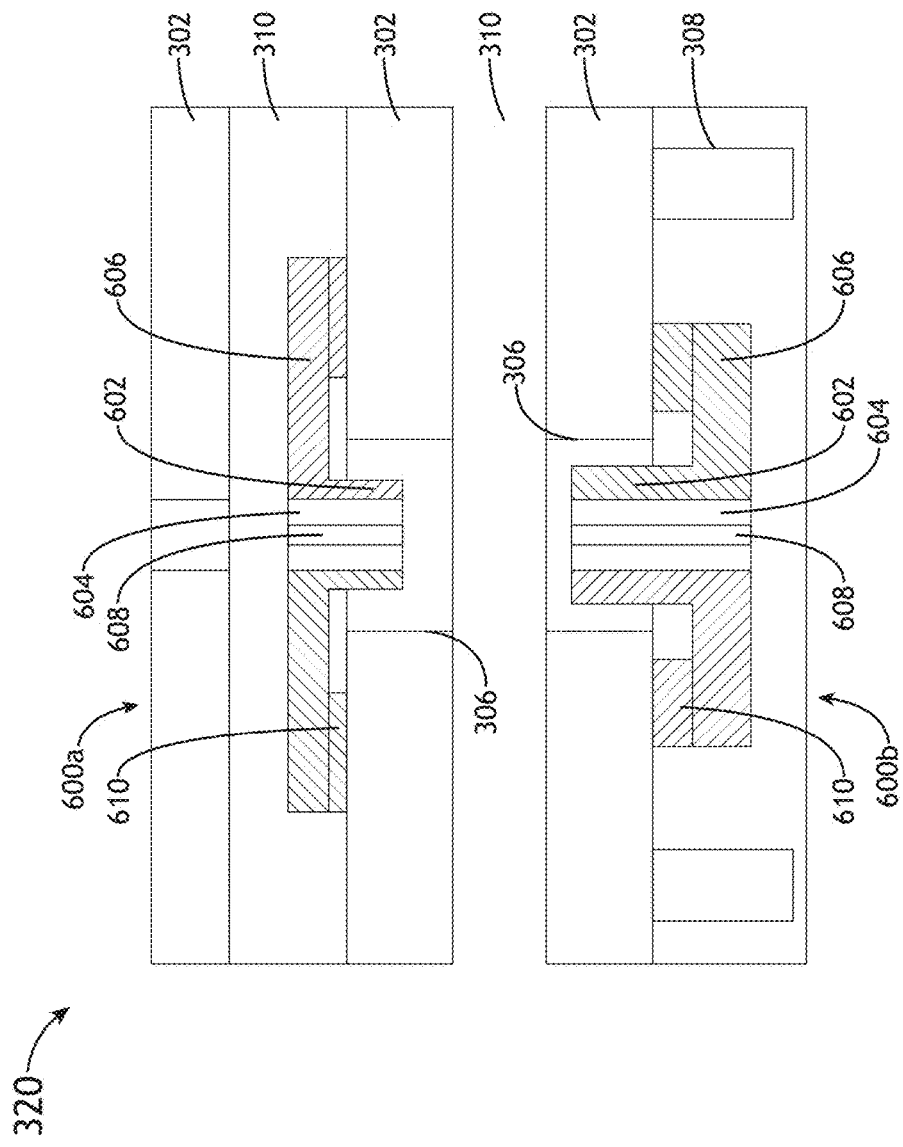
FIG. 6 illustrates a cross-section view of a set of primary electron beam deflectors of an electron-optical column, in accordance with one or more embodiments of the present disclosure.

FIG. 6 illustrates a cross-section view of a set of primary electron beam deflectors 600 of an electron-optical column 320, in accordance with one or more embodiments of the present disclosure.

In one embodiment, each the one or more electron-optical columns 320 include one or more sets of beam deflectors 600. For example, a set of beam deflectors 600 may include, but is not limited to, an upper beam deflector 600a and a lower beam deflector 600b. In another embodiment, the beam deflectors 600a, 600b include a barrel portion 602 and a disc portion 606. In another embodiment, the barrel portion 602 is inserted into a hole of a substrate array 302, where the portion of the hole includes an unprotected portion 304. In another embodiment, a hole 604 is bored through the top of the barrel portion 602 and the bottom of the disc portion 606. For example, the hole 604 allows an electron beam 101 to pass through the beam deflectors 600a, 600b. In another embodiment, the hole 604 has one or more critical tolerances. For example, the critical tolerances may include, but are not limited to, a bore size and/or a bore shape.

In another embodiment, the beam deflectors 600a, 600b include one or more slots 608. For example, the one or more slots 608 may be partially cut into the beam deflectors 600a, 600b, such that the one or more slots 608 cut through the barrel portion 602 and the disc portion 606 of the beam deflectors 600a, 600b without extending to the edge of the disc portion 606. It is noted herein that if the one or more slots 608 extended to the edge of the disc portion 606, the beam deflectors 600a, 600b would be segmented into multiple individual beam deflector poles.

In another embodiment, the beam deflectors 600a, 600b include a raised region 610 on an outer area of the disc portion 606. For example, the raised region 610 may offset an inner area of the disc portion 606 from the top surface or the bottom surface of the substrate array 302 at a distance equal to the height of the raised region 610. In another embodiment, the beam deflectors 600a, 600b include one or more grooves in the raised region 610. For example, the one or more grooves in the raised region 610 may be work areas for post-bonding fabrication processes to ensure the post-bonding fabrication processes do not damage (or otherwise interfere with the operation of) the substrate array 302.

It is noted herein, however, that the beam deflectors 600a, 600b may not include a raised region 610 and/or the one or more grooves within the raised region 610. In this regard, the surface of the disc portion 606 of the beam deflectors 600a, 600b may be bonded directly to the substrate array 302. Therefore, the above description should not be interpreted as a limitation on the scope of the present disclosure but merely an illustration.

Post-bonding fabrication processes are described in further detail in application Ser. No. 15/612,862, filed on Jun. 2, 2017, which is incorporated previously herein in its entirety.

Figure 7:
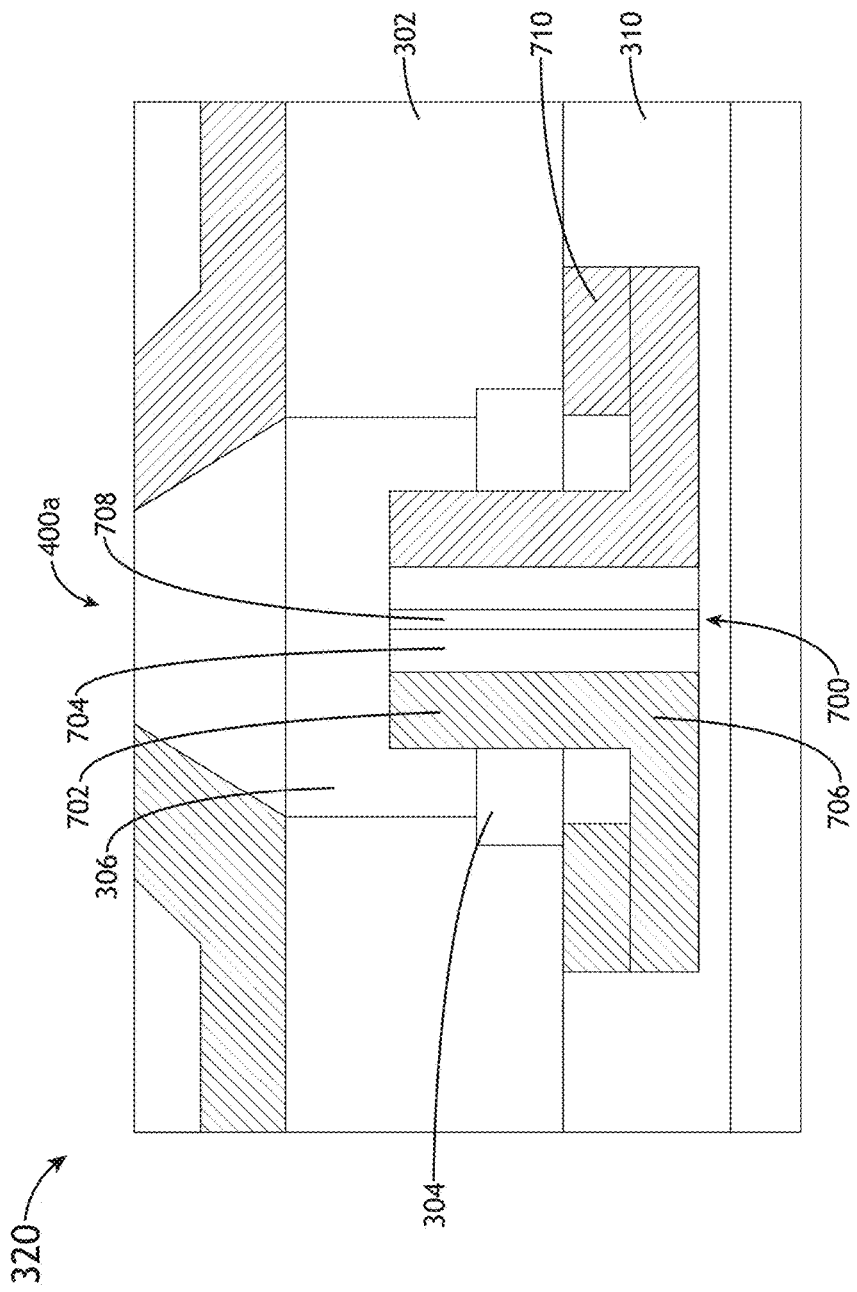
FIG. 7 illustrates a gun multipole beam deflector of an electron-optical column, in accordance with one or more embodiments of the present disclosure.

FIG. 7 illustrates a gun multipole beam deflector 700 of an electron-optical column 320, in accordance with one or more embodiments of the present disclosure.

In one embodiment, the gun multipole beam deflector 700 may be any multipole beam deflector 700 known in the art. For example, the gun multipole beam deflector 700 may include between 2 and 24 poles. For instance, the gun multipole beam deflector 700 may be a gun quadrupole beam deflector 700. Additionally, the gun multipole beam deflector 700 may be a gun octupole beam deflector 700. In another embodiment, the gun multipole beam deflector 700 includes the same number of poles as the beam deflectors 600a, 600b.

In another embodiment, the gun multipole beam deflector 700 includes a barrel portion 702 and a disc portion 706. In another embodiment, the barrel portion 706 is inserted into a hole of a substrate array 302, where the hole includes a coating 306, where the hole also includes an unprotected portion 304. In another embodiment, a hole 704 is bored through the top of the barrel portion 702 and the bottom of the disc portion 706. For example, the hole 704 allows an electron beam 101 to pass through the gun multipole beam deflector 700. In another embodiment, the hole 704 has one or more critical tolerances. For example, the critical tolerances may include, but are not limited to, a bore size and/or a bore shape.

In another embodiment, the gun multipole beam deflector 700 includes one or more slots 708. For example, the one or more slots 708 may be partially cut into the gun multipole beam deflector 700, such that the one or more slots 708 cut through the barrel portion 702 and the disc portion 706 of the gun multipole beam deflector 700 without extending to the edge of the disc portion 706. It is noted herein that if the one or more slots 708 extended to the edge of the disc portion 706, the gun multipole beam deflector 700 would be segmented into multiple individual beam deflector poles.

In another embodiment, the gun multipole beam deflector 700 includes a raised region 710 on an outer area of the disc portion 706. For example, the raised region 710 may offset an inner area of the disc portion 706 from the top surface or the bottom surface of the substrate array 302 at a distance equal to the height of the raised region 710. In another embodiment, the gun multipole beam deflector 700 includes one or more grooves in the raised region 710. For example, the one or more grooves in the raised region 710 may be work areas for post-bonding fabrication processes to ensure the post-bonding fabrication processes do not damage (or otherwise interfere with the operation of) the substrate array 302.

It is noted herein, however, that the gun multipole beam deflector 700 may not include a raised region 710 and/or the one or more grooves within the raised region 710. In this regard, the surface of the disc portion 706 may be bonded directly to the substrate array 302. Therefore, the above description should not be interpreted as a limitation on the scope of the present disclosure but merely an illustration.

Post-bonding fabrication processes are described in further detail in application Ser. No. 15/612,862, filed on Jun. 2, 2017, which is incorporated previously herein in its entirety.

Figure 8:
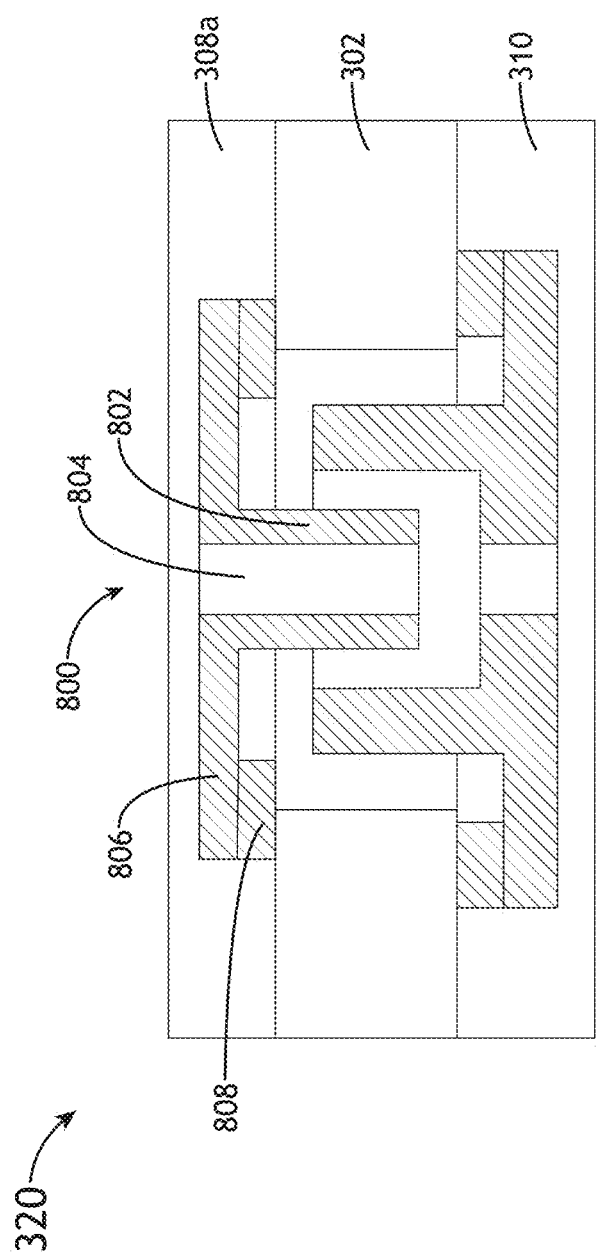
FIG. 8 illustrates a gun condenser of an electron-optical column, in accordance with one or more embodiments of the present disclosure.

FIG. 8 illustrates a gun condenser 800 of an electron-optical column 320, in accordance with one or more embodiments of the present disclosure.

In one embodiment, the gun condenser 800 is set within a shield layer 308. In another embodiment, the gun condenser 800 includes a barrel portion 802 and a disc portion 806. In another embodiment, the barrel portion 806 is inserted into a hole of a substrate array 302. In another embodiment, a hole 804 is bored through the top of the barrel portion 802 and the bottom of the disc portion 806. For example, the hole 804 allows an electron beam 101 to pass through the gun condenser 800. In another embodiment, the hole 804 has one or more critical tolerances. For example, the critical tolerances may include, but are not limited to, a bore size and/or a bore shape.

In another embodiment, the gun condenser 800 includes a raised region 808 on an outer area of the disc portion 806. For example, the raised region 808 may offset an inner area of the disc portion 806 from the top surface or the bottom surface of the substrate array 302 at a distance equal to the height of the raised region 808.

It is noted herein, however, that the gun condenser 800 may not include a raised region 808. In this regard, the surface of the disc portion 806 may be bonded directly to the substrate array 302. Therefore, the above description should not be interpreted as a limitation on the scope of the present disclosure but merely an illustration.

Figure 9:
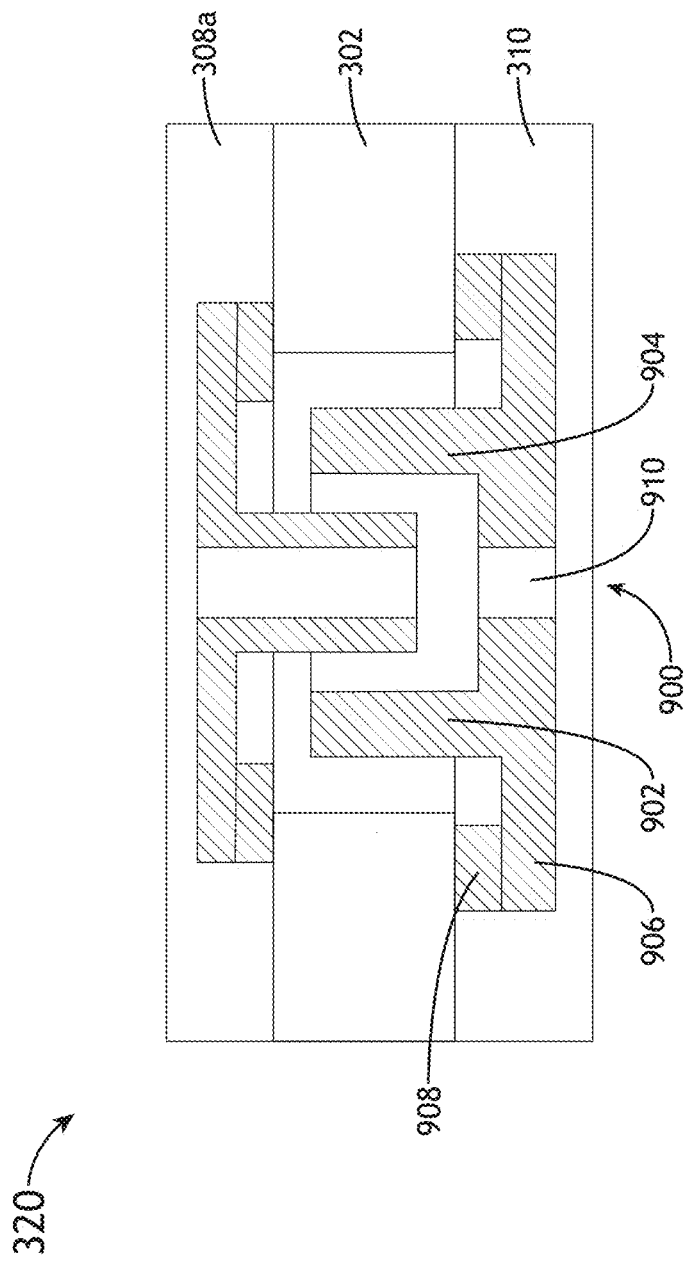
FIG. 9 illustrates an anode of an electron-optical column, in accordance with one or more embodiments of the present disclosure.

FIG. 9 illustrates an anode 900 of an electron-optical column 320, in accordance with one or more embodiments of the present disclosure.

In one embodiment, the anode 900 includes a barrel portion 902 and a disc portion 906. In another embodiment, the barrel portion 906 is inserted into a hole of a substrate array 302.

In another embodiment, a hole 904 is bored a selected depth through the top of the barrel portion 902. For example, the hole 904 allows an electron beam 101 to pass through the anode 900. In another embodiment, the hole 904 has one or more critical tolerances. For example, the critical tolerances may include, but are not limited to, a bore size and/or a bore shape. In another embodiment, at least a portion of the barrel portion 802 of the gun condenser 800 is inserted within the hole 904 of the anode 900 (e.g. the diameter of the barrel portion 802 is smaller than the diameter of the hole 904).

In another embodiment, the anode 900 includes a raised region 908 on an outer area of the disc portion 906. For example, the raised region 908 may offset an inner area of the disc portion 906 from the top surface or the bottom surface of the substrate array 302 at a distance equal to the height of the raised region 908.

It is noted herein, however, that the anode 900 may not include a raised region 908. In this regard, the surface of the disc portion 906 may be bonded directly to the substrate array 302. Therefore, the above description should not be interpreted as a limitation on the scope of the present disclosure but merely an illustration.

In another embodiment, a hole 910 is bored through the bottom of the disc portion 906 to join with the hole 904. For example, the hole 910 may include a first cylindrical section with a first diameter, a second cylindrical section with a second diameter, and a cone-shaped portion coupling the first cylindrical section with a first diameter and the second cylindrical section with a second diameter. By way of another example, the hole 910 may have a cylindrical cross-section.

Figure 10:
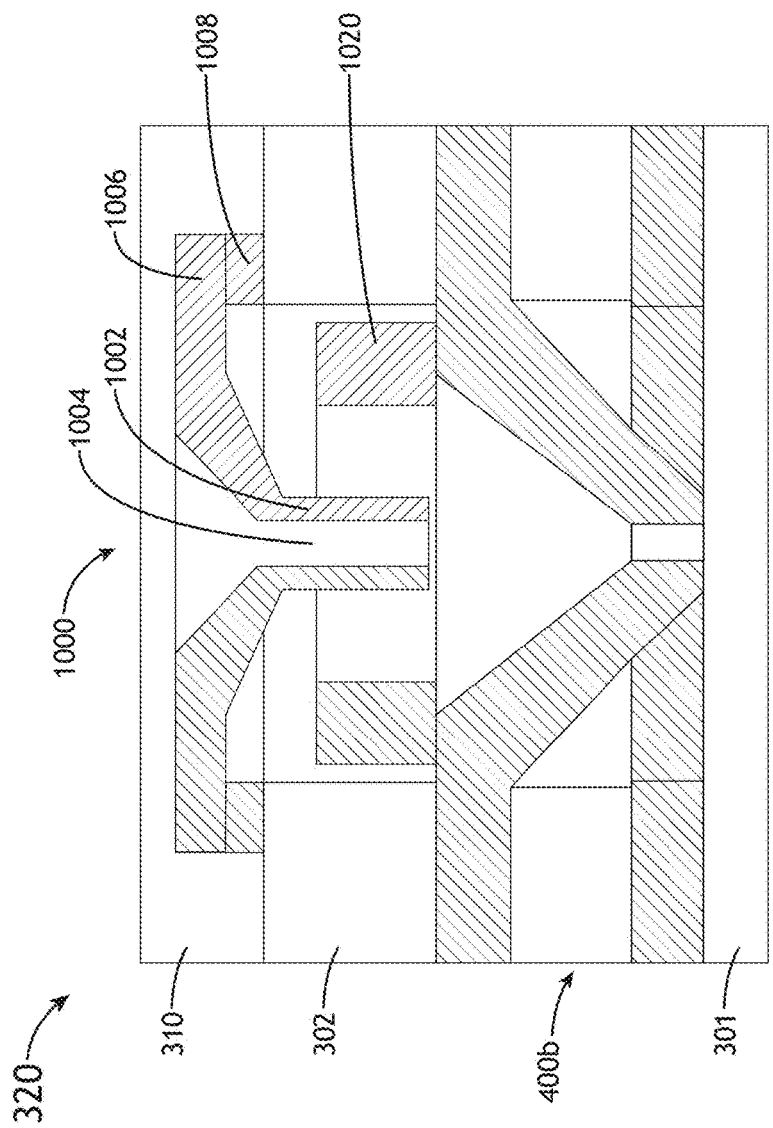
FIG. 10 illustrates a dynamic focus lens and a magnetic lens assembly of an electron-optical column, in accordance with one or more embodiments of the present disclosure.

FIG. 10 illustrates a dynamic focus lens 1000 and a magnetic lens assembly 400 (e.g. a magnetic focus lens 400b) of an electron-optical column 320, in accordance with one or more embodiments of the present disclosure.

In one embodiment, the dynamic focus lens 1000 includes a barrel portion 1002 and a disc portion 1006. For example, the barrel portion 1002 and the disc portion 1006 may be coupled via a set of walls, where a cross-section of the sets of walls is conical. By way of another example, the barrel portion 1002 and the disc portion 106 are coupled at a substantially 90-degree angle. In another embodiment, the dynamic focus lens 1000 includes a hole 1004 bored through a bottom surface of the disc portion 1006 and a top surface of the barrel portion 1002. For example, the hole 1004 may include a cylindrical-shaped section with a first diameter and a conical-shaped section with the first diameter at one end (e.g. a small cone diameter) and a second diameter at a second end (e.g. a large cone diameter). By way of another example, the hole 1004 may have a cylindrical cross-section.

In another embodiment, the dynamic focus lens 1000 includes a raised region 1008 on an outer area of the disc portion 1006. For example, the raised region 1008 may offset an inner area of the disc portion 1006 from the top surface or the bottom surface of the substrate array 302 at a distance equal to the height of the raised region 1008.

It is noted herein, however, that the dynamic focus lens 1000 may not include a raised region 1008. In this regard, the surface of the disc portion 1006 may be bonded directly to the substrate array 302. Therefore, the above description should not be interpreted as a limitation on the scope of the present disclosure but merely an illustration.

In another embodiment, the dynamic focus lens 1000 includes a fabricated shield 1020. In another embodiment, the shield 1020 includes a wall of a selected thickness that defines a hole of a selected diameter. For example, the diameter of the defined hole may be the same as the large cone diameter of the magnetic focus lens 400b. By way of another example, at least a portion of the barrel portion 1002 is inserted within the shield 1020 (e.g. the diameter of the barrel portion 1002 is smaller than the diameter of the shield 1020 hole). In another embodiment, the shield 1020 is implemented where a film coating 306, as illustrated in FIGS. 3, 5A, and 7, may not be applied. It is noted herein that a shield 1020 may be implemented instead of a film coating 306 in any of the one or more electron-optical columns 320. Therefore, the above description should not be interpreted as a limitation on the scope of the present disclosure but merely an illustration.

FIG. 11 illustrates a cross-section view of an electrical connection management assembly 1100 for the column assembly 300, in accordance with one or more embodiments of the present disclosure.

In one embodiment, the electrical connection management assembly 1100 includes one or more low-voltage and high-voltage signal and/or ground connections (LV/HV connections). For example, each electron-optical column 320 of the column assembly 300 may include, but is not limited to, between 4-120 low-voltage and high-voltage signal and/or ground connections. In another embodiment, one or more of the LV/HV connections are shielded to minimize crosstalk from neighboring signal lines and other environmental disturbances. In another embodiment, one or more of the LV/HV connections are impedance-controlled for high speed usage. In another embodiment, one or more of the LV/HV connections pass through a vacuum region (described in detail further herein) to the atmospheric region surrounding the system 100.

In another embodiment, the assembly 1100 includes one or more high-density feedthroughs 1102. In another embodiment, the feedthroughs 1102 are fabricated from one or more substrate layers. For example, the one or more substrate layers may be fabricated from a co-fired ceramic. In another embodiment, the one or more feedthroughs 1102 are coupled to the column assembly 300 and positioned outside a column region 1304 of the vacuum system 1300 (described in detail further herein). In another embodiment, the one or more high-density feedthroughs 1102 are configured to accommodate the electrical contacts and high-voltage requirements of the column assembly 300. In another embodiment, each of the one or more high-density feedthroughs 1102 include one or more contact pads (e.g. one or more ground contact pads and/or one or more signal contact pads) patterned on one or more surfaces of the feedthrough 1102.

The use of a high-density feedthrough with a substrate is generally described in U.S. Pat. No. 9,591,770, issued on Mar. 7, 2017, which is incorporated herein by reference in its entirety.

In another embodiment, the assembly 1100 includes one or more flex cables 1108. For example, the one or more flex cables 1108 may include, but are not limited to, one or more flex cables 1200, one or more flex cables 1220, and/or one or more flex cables 1240, described in detail further herein. In another embodiment, the one or more flex cables 1108 transmit one or more electrical signals from the one or more feedthroughs 1102 to the one or more substrate arrays 302. For example, the one or more flex cables 1108 may transmit the one or more electrical signals from the one or more feedthroughs 1102 coupled to the column assembly 300 and positioned outside of the column region 1304 of the vacuum system 1300 to the one or more substrate arrays 302 positioned within the column region 1304 of the vacuum system 1300.

In another embodiment, the one or more ground contact pads on the one or more feedthroughs 1102 are electrically coupled to the one or more ground contact pads on the one or more substrate arrays 302 via the one or more flex cables 1108, where the one or more ground contact pads on the one or more substrate arrays 302 are electrically coupled to the one or more column electron-optical elements 340. In another embodiment, the one or more signal contact pads on the one or more feedthroughs 1102 are electrically coupled to the one or more signal contact pads on the one or more substrate arrays 302 via the one or more flex cables 1108, where the one or more signal contact pads on the one or more substrate arrays 302 are electrically coupled to the one or more column electron-optical elements 340. In this regard, the one or more ground contact pads and the one or more signal contact pads on the one or more feedthroughs 1102 are electrically coupled to the one or more column electron-optical elements 340 bonded to the one or more substrate arrays 302.

In another embodiment, the assembly 1100 includes one or more interposers 1106, where the one or more interposers 1106 are an electrical bridge between the flex cables 1108 and the one or more feedthroughs 1102. In another embodiment, the assembly 1100 includes a clamp 1104, where the clamp 1104 compresses one or more of a flex cable 1108 or an interposer 1106 to a particular substrate array 302 or a particular feedthrough 1102. For example, the interposers 1106 may include an array of spring contacts between a flex cable 1108 and a particular substrate array 302 or a particular feedthrough 1102. For instance, the one or more interposers 1106 may include a continuous array of all-metal spring contacts. By way of another example, the one or more interposers 1106 may include polyimide materials instead of standard core dielectric materials for low outgassing in vacuum.

Figure 12A:
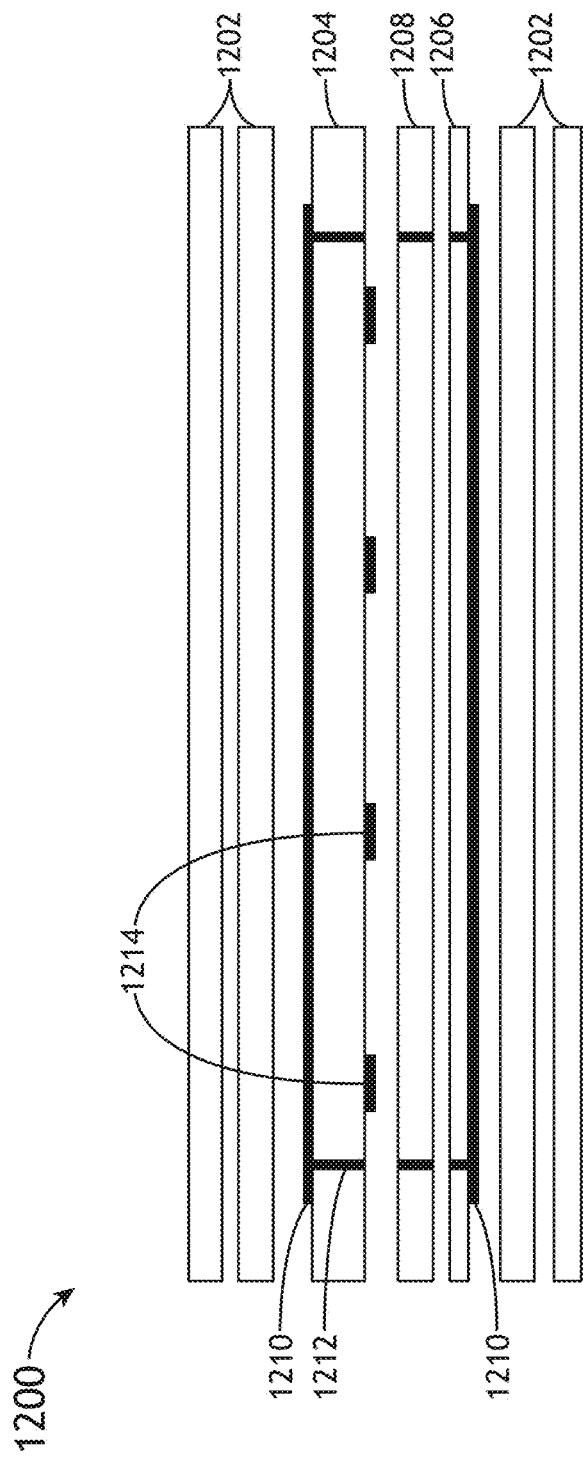
FIG. 12A illustrates a cross-section view of a flex cable for a multi-column SEM system, in accordance with one or more embodiments of the present disclosure.
Figure 12B:
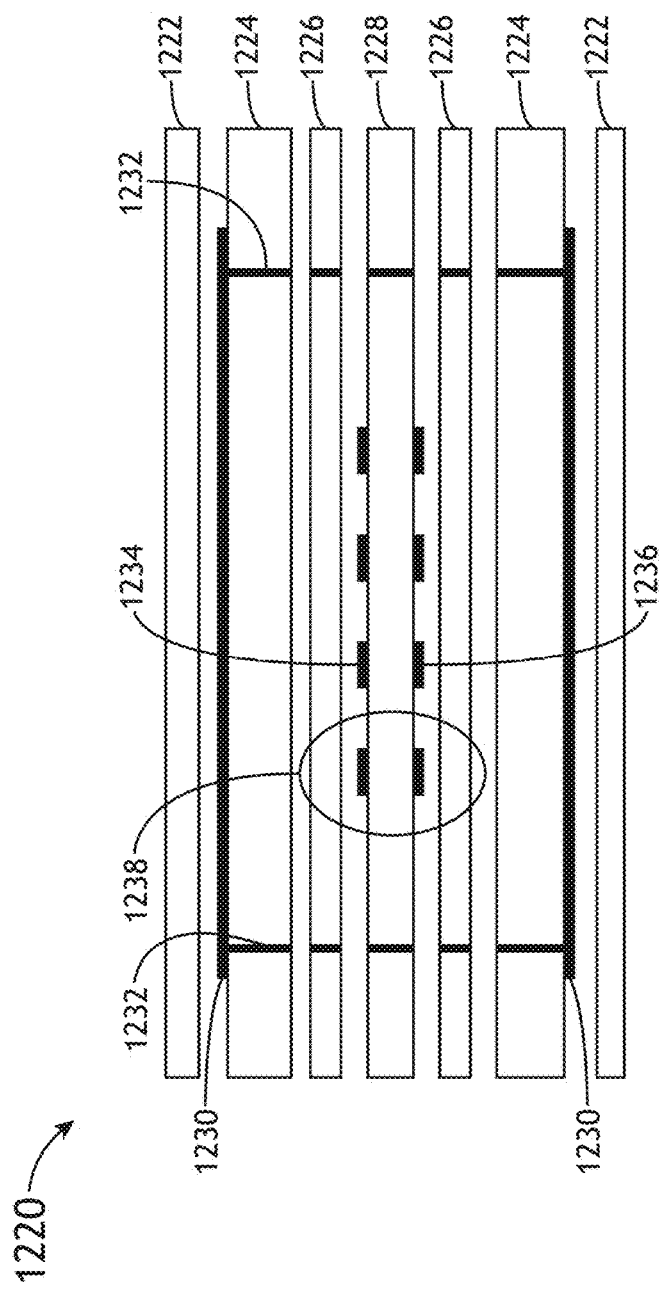
FIG. 12B illustrates a cross-section view of a flex cable for a multi-column SEM system, in accordance with one or more embodiments of the present disclosure.
Figure 12C:
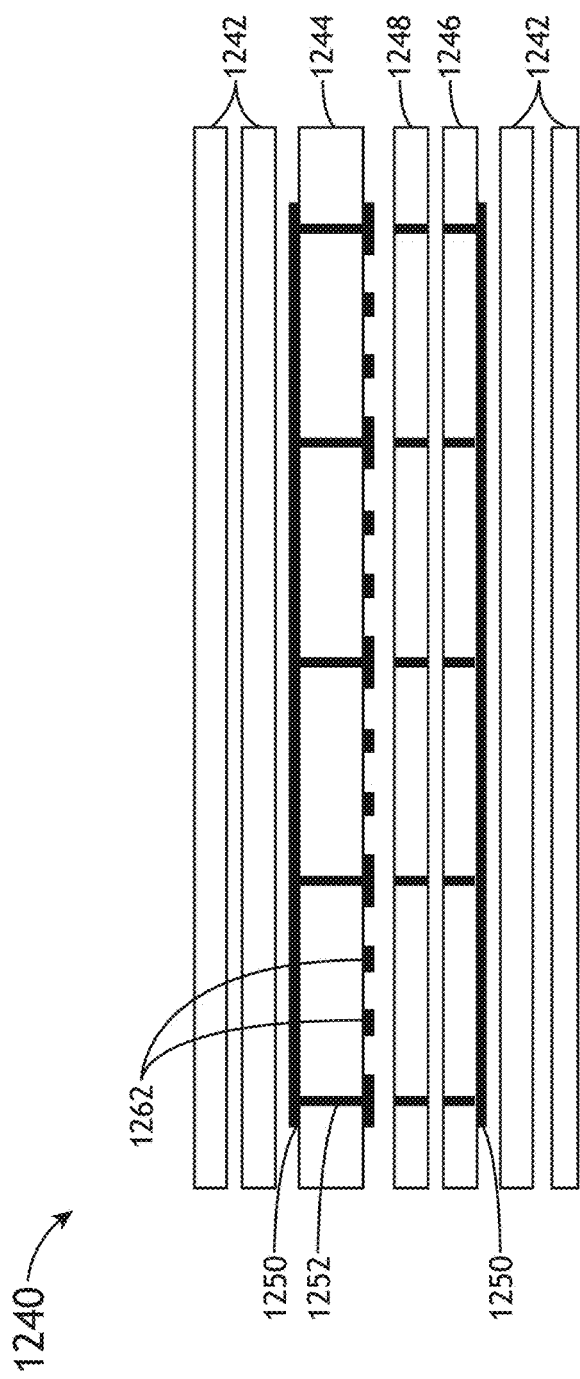
FIG. 12C illustrates a cross-section view of a flex cable for a multi-column SEM system, in accordance with one or more embodiments of the present disclosure.

FIGS. 12A-12C illustrate a cross-section view of a flex cable 1200, 1220, 1240 for a multi-column SEM system 100, in accordance with one or more embodiments of the present disclosure.

In one embodiment, the flex cables 1200, 1220, 1240 are constructed of multiple layers of polyimide films. In another embodiment, the flex cables 1200, 1220, 1240 includes one or more layers of copper cladding. In another embodiment, at least a portion of the one or more layers of copper cladding in the flex cables 1200, 1220, 1240 is etched away prior to laminating, to expose one or more copper lines and/or contact pads for use as one or more signal layers and/or one or more shielding layers. For example, the one or more signal layers and/or the one or more shielding layers may be electrically coupled to one or more metal layers embedded within the one or more substrate arrays 302 and/or one or more contact pads on both ends of the one or more substrate arrays 302.

In one embodiment, as shown in FIG. 12A, the flex cable 1200 is a lens cable. For example, the lens cable 1200 may be electrically coupled to one or more of the one or more extractors 312, the one or more magnetic lens assemblies 400a, 400b, the one or more gun condensers 800, the one or more anodes 900, and/or the one or more dynamic focus lenses 1000. In another embodiment, the lens cable 1200 includes one or more signal trace layers 1214. For example, the one or more signal trace layers 1214 may range from 1 to 5 mil wide. In another embodiment, the lens cable 1200 includes one or more shield layers 1210 above and/or below the one or more signal trace layers 1214, where the one or more shield layers 1210 are electrically coupled together with one or more vias 1212. In another embodiment, the lens cable 1200 includes one or more insulation layers 1202, 1204, 1206, 1208. For example, the one or more insulation layers 1202, 1204, 1206, 1208 may range from 0.5 to 10 mil thick.

In one embodiment, as illustrated in FIG. 12B, the flex cable 1220 is a deflection cable. For example, the deflection cable 1200 may be electrically coupled to one or more of the one or more upper beam deflectors 600a, the one or more lower beam deflectors 600b, and/or the one or more gun multipole beam deflector 700. In another embodiment, the deflector cable 1220 includes one or more signal trace layers 1234. For example, the one or more signal trace layers 1234 may range from 1 to 5 mil wide. In another embodiment, the deflector cable 1220 includes one or more signal trace layers 1236. For example, the one or more signal trace layers 1236 may range from 1 to 5 mil wide. In another embodiment, the one or more signal trace layers 1234 and the one or more signal trace layers 1236 are separated into one or more differential pairs 1238. In another embodiment, the deflector cable 1220 includes one or more shielding layers 1230 above and/or below the one or more signal trace layers 1234 and 1236, where the one or more shield layers 1230 are electrically coupled together with one or more vias 1232. In another embodiment, the deflector cable 1220 includes one or more insulation layers 1222, 1224, 1226, 1228. For example, the one or more insulation layers 1222, 1224, 1226, 1228 may range from 0.5 to 10 mil thick.

In one embodiment, as illustrated in FIG. 12C, the flex cable 1240 includes a detector cable. For example, the detector cable 1240 may be electrically coupled to the one or more detector assemblies 500. In another embodiment, the detector cable 1240 includes one or more signal trace layers 1262. For example, the one or more signal trace layers 1262 may range from 1 to 5 mil wide. In another embodiment, the detector cable 1240 includes one or more shield layers 1250 above and/or below the one or more signal trace layers 1262, where the one or more shield layers 1250 are electrically coupled together with one or more vias 1252. In another embodiment, the detector cable 1240 includes one or more insulation layers 1242, 1244, 1246, 1248. For example, the one or more insulation layers 1242, 1244, 1246, 1248 may range from 0.5 to 10 mil thick.

It is noted herein that the arrangement and design of the components of flex cable 1200, 1220, 1240 is provided purely for illustration, and is not to be understood as limiting for purposes of the present disclosure.

Figure 13:
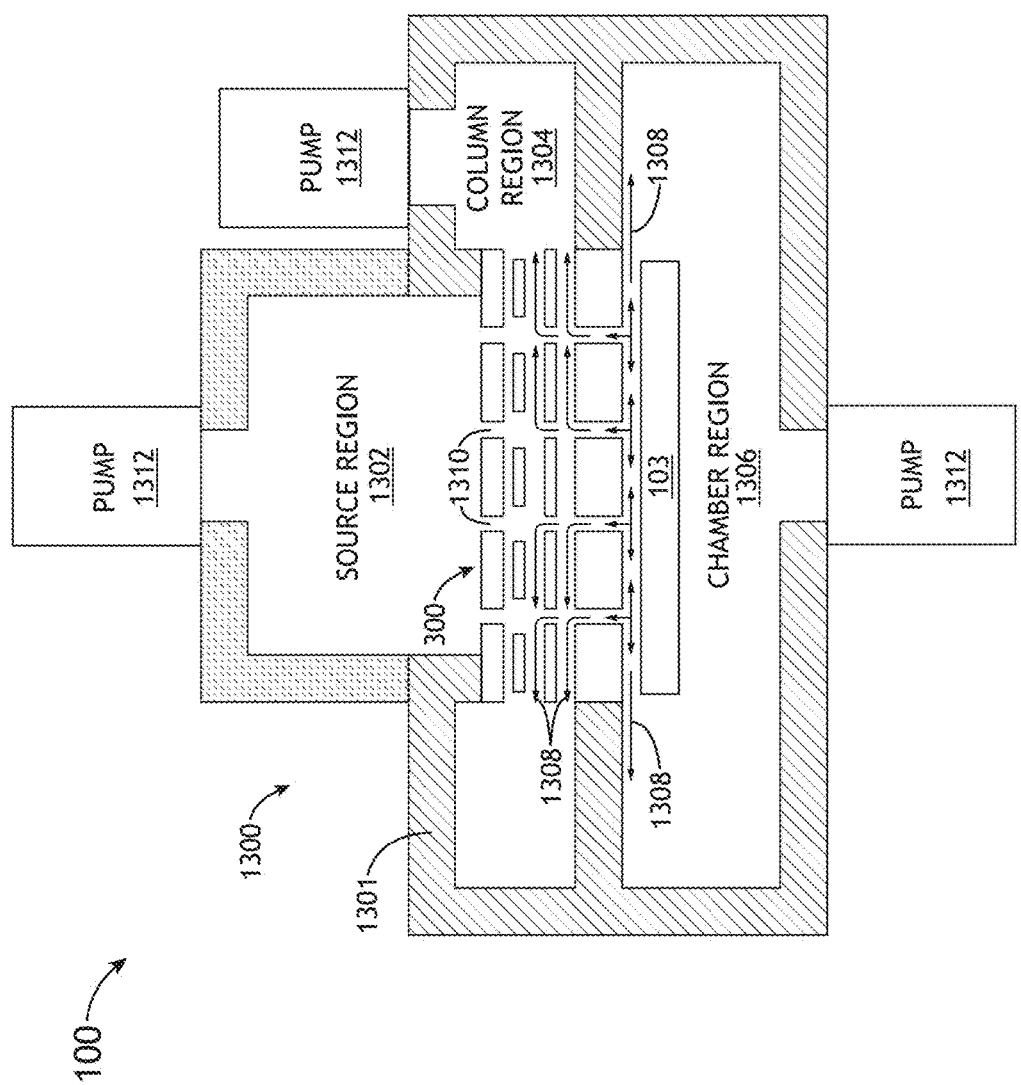
FIG. 13 illustrates a schematic view of a vacuum system for a multi-column SEM system, in accordance with one or more embodiments of the present disclosure.

FIG. 13 illustrates a schematic view of a vacuum system for a multi-column SEM system, in accordance with one or more embodiments of the present disclosure.

In one embodiment, the system 100 includes a vacuum system 1300. In another embodiment, the vacuum system 1300 includes a set of frame structure components 1301. It is noted herein that one or more of the frame structure components 1301 may be shared with the frame 201 source assembly 200 and/or the frame 301 of the source assembly 300.

In another embodiment, the vacuum system 1300 includes a source region 1302. For example, the source region 1302 may be an ultra-high vacuum (UHV) region of the vacuum system 1300. By way of another example, the source region 1302 may include the source assembly 200. It is noted herein that the various materials (e.g. tungsten, titanium, alumina, zirconium oxide, and the like) from which the components of the source assembly 200 may be fabricated are all UHV-compatible at both the power-off temperatures and the higher operation temperatures of the source assembly 200.

In another embodiment, the vacuum system 1300 includes a column region 1304. For example, the column region 1304 may be a high-vacuum (HV) region of the vacuum system 1300. By way of another example, the column region 1304 may include the column assembly 300. In another embodiment, the vacuum system 1300 includes a chamber region 1306. For example, the chamber region 1306 may be an HV region of the vacuum system 1300. By way of another example, the chamber region 1306 may include the stage 102 and secured sample 103.

In one embodiment, the column electron-optical elements 340 within the column assembly 300 operate at selected voltages with respect to one another. In another embodiment, the electrical voltages for the column electron-optical elements 340 are selected so as to prevent breakdown in vacuum on dielectric surfaces (e.g. on a same substrate array 302), through bulk insulating material (e.g. between layers of each electron-optical column 320), and/or between column electron-optical elements 340 across a gap within the column assembly 300.

In another embodiment, maintaining a vacuum level within one or more of the source region 1302, the column region 1304, and/or the chamber region 1306 requires one or more components within the source region 1302, column region 1304, and/or the chamber region 1306 to be cleaned and outgassed. In another embodiment, maintaining a selected vacuum level within one or more of the column region 1304 and/or the chamber region 1306 when implementing a selected voltage requires one or more components within the source region 1302, the column region 1304, and/or the chamber region 1306 to have a minimum separation gap. For example, the minimum separation gap may be accomplished via a polishing of surfaces of components in the areas of high electrical stress. By way of another example, the components in the areas of high electrical stress may have rounded edges to minimize high field gradients. By way of another example, where the minimum separation gap may not be achieved via design rules, the minimum separation gap may be filled with a dielectric material including, but not limited to, a ceramic or a polyimide film. In another embodiment, maintaining a selected vacuum level within one or more of the column region 1304 and/or the chamber region 1306 when implementing a selected voltage requires one or more airways 1308 to one or more vacuum pumps 1312 within the source region 1302, the column region 1304, and/or the chamber region 1306.

In another embodiment, one or more column electron-optical elements 340 isolated by a dielectric material are separated at a distance to keep the field strength along the insulator (tangential field) low. In another embodiment, surface path length is increased in areas where design space is limited by adding a contoured profile. In another embodiment, triple point junctions are shielded with geometric designs. For example, the geometric designs may include, but are not limited to, recesses and/or guard rings. By way of another example, the geometric designs may suppress or reduce field enhancements that may initiate electrical discharges, which may subsequently propagate across the entire insulator.

In one embodiment, the vacuum system 1300 includes one or more airways 1308. For example, the one or more airways 1308 may allow for the passage of gas between the substrate arrays 302 to the one or more vacuum pumps 1312. In another embodiment, the vacuum system 1300 includes one or more vented screws and/or fabricated channels within the set of frame structure components 1301. For example, the one or more vented screws and/or fabricated channels may allow for the passage of gas from blind holes and/or trapped volumes within the vacuum system 1300.

In another embodiment, the vacuum system 1300 includes one or more vacuum pumps 1312. For example, the one or more vacuum pumps 1312 may include, but are not limited to, one or more turbo pumps. By way of another example, the one or more vacuum pumps 1312 may include, but are not limited to, one or more ion pumps, one or more getter pumps, and/or one or more cryo pumps. By way of another example, the one or more vacuum pumps 1312 may include, but are not limited to, any vacuum pump known in the art.

By way of another example, the vacuum pumps 1312 may be coupled to one or more of the source region 1302, the column region 1304, and/or the chamber region 1306. In another embodiment, the vacuum pumps 1312 generate and/or maintain the required vacuum levels within the source region 1302, the column region 1304, and/or the chamber region 1306.

In another embodiment, the source assembly 200 is isolated in the source region 1302 from the electron-optical column assembly 300 via an array of conductance-limiting apertures 1310 during operation of the system 100, where the conductance-limiting apertures 1310 are designed to limit or isolate gas flow from the column region 1304 to the source region 1302.

It is noted herein the use of a vacuum assembly to generate differential pumping in a multi-column SEM system is generally described in U.S. Pat. No. 8,106,355, issued on Jan. 31, 2012, which is incorporated herein by reference in its entirety.

Advantages of the present disclosure include individualized electron beam positioning of each electron beam source in an illumination source assembly for a multi-beam SEM system. Advantages of the embodiments of the present disclosure include individualized electron beam tuning and scan control of each electron-optical column 320 of the column assembly 300. Advantages of embodiments of the present disclosure also include an individualized dual-scan and dynamic-scan correction capability for each column electron-optical element 340 (e.g. individualized magnetic focusing via micro-lenses, individualized adjustable electrostatic focus to allow for moderate variation of working distances from surface and/or stage local height variations, and the like) within each electron-optical column 320.

Advantages of the present disclosure also include secondary electron detectors in electron-optical column 320 in a column assembly 300 for a multi-beam SEM system 100, where the secondary electron detectors are placed on a single substrate array, where the substrate array includes amplifier circuits for each of the secondary electron detectors.

Advantages of the present disclosure also include a circuit-board type arrangement of the substrate arrays 302 in the column assembly 300. Advantages of the present disclosure also include an individualized micro-lens plug method of fabrication that allows for selectability and scalability while fabricating each electron-optical column 320 in the column assembly 300 for a multi-beam SEM system 100. Advantages of the present disclosure also include individualized electrostatic potential control, which allows for targeted correction of fabrication errors of each electron-optical column 320 in a column assembly 300 for a multi-beam SEM system 100.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated " such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., " a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., " a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B".

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A multi-column scanning electron microscopy (SEM) system comprising:
    a source assembly comprising:
        two or more electron beam sources configured to generate a plurality of electron beams, wherein an electron beam source of the two or more electron beam sources is configured to generate an electron beam of the plurality of electron beams; and
        two or more sets of positioners coupled to the two or more electron beam sources, wherein a set of positioners of the two or more sets of positioners is configured to individually translate an electron beam source of the two or more electron beam sources;
    a column assembly comprising:
        a plurality of substrate arrays; and
        two or more electron-optical columns, wherein an electron-optical column of the two or more electron-optical columns is formed by a set of column electron-optical elements bonded to the plurality of substrate arrays, wherein the set of column electron-optical elements includes one or more beam deflectors and one or more electron-optical lenses positioned between one or more magnetic condenser lenses and one or more magnetic focus lenses; and
    a stage configured to secure a sample, wherein an electron-optical column of the two or more electron-optical columns are configured to direct at least a portion of an electron beam of the plurality of electron beams to a surface of the sample, wherein the sample emits or scatters electrons in response to the at least a portion of an electron beam of the plurality of electron beams.

2. The system in claim 1, wherein the source assembly comprises:
    two or more sets of source electron-optical elements, wherein a set of source electron-optical elements of the two or more sets of source electron-optical elements is configured to direct at least a portion of an electron beam of the plurality of electron beams to an electron-optical column of the two or more electron-optical columns.

3. The system in claim 1, wherein an electron beam source of the two or more electron beam sources includes:
    at least one of a Schottky emitter device, a carbon nanotube (CNT) emitter, a nanostructured carbon film emitter, or a Muller-type emitter.

4. The system in claim 1, wherein a set of positioners of the two or more sets of positioners include one or more positioners configured to individually translate an electron beam source of the two or more electron beam sources in at least one of an x-direction, a y-direction, or a z-direction.

5. The system in claim 4, wherein the set of positioners of the two or more sets of positioners includes a first positioner configured to translate the electron beam source of the two or more electron beam sources in an x-direction, a second positioner configured to translate the electron beam source of the two or more electron beam sources in a y-direction, and a third positioner configured to translate the electron beam source of the two or more electron beam sources in a z-direction.

6. The system in claim 4, wherein the one or more positioners are individually adjustable.

7. The system in claim 1, wherein the plurality of substrate arrays is arranged within a plurality of substrate array assemblies, wherein a substrate array assembly of the plurality of substrate array assemblies includes one or more substrate arrays of the plurality of substrate arrays.

8. The system in claim 7, wherein at least one shielding element is positioned between the one or more substrate arrays.

9. The system in claim 1, wherein a substrate array of the plurality of substrate arrays comprise:
    a composite substrate formed from a plurality of substrate layers, wherein the composite substrate includes a plurality of holes;
    a plurality of electrical components embedded within the plurality of substrate layers; and
    one or more metal layers coupled to at least one surface of the composite substrate.

10. The system in claim 9, wherein a column electron-optical element of the set of column-electron optical elements is bonded to the composite substrate and is positioned over a hole of the plurality of holes in the composite substrate.

11. The system in claim 9, wherein a column electron-optical element of the set of column-electron optical elements is bonded to the composite substrate, is positioned over a hole of the plurality of holes in the composite substrate, and is partially inserted within the hole of the plurality of holes in the composite substrate.

12. The system in claim 10, wherein a portion of the hole of the plurality of holes includes at least one of a coating formed via a thin film metallization process, a fabricated shield, or unprotected substrate.

13. The system in claim 9, wherein a column electron-optical element of the set of column-electron optical elements is bonded to a metal layer of the one or more metal layers.

14. The system in claim 9, wherein the plurality of electrical components embedded within the plurality of substrate layers include one or more electrical traces and one or more electrical vias.

15. The system in claim 14, wherein the one or more electrical traces are electrically coupled to one or more bonding pads in the one or more metal layers with the one or more electrical vias.

16. The system in claim 14, wherein the one or more electrical traces are electrically coupled to one or more connector contact pads coupled to at least one surface of the composite layer.

17. The system in claim 9, wherein the one or more metal layers are formed via at least one of a thin-film or a thick-film metallization process.

18. The system in claim 1, wherein the two or more electron-optical columns include one or more identical column electron-optical elements, wherein the one or more identical electron-optical elements is bonded to a same surface of a substrate array of the plurality of substrate arrays.

19. The system in claim 1, wherein the set of column electron-optical elements within an electron-optical column includes one or more extractors.

20. The system in claim 1, wherein the set of column electron-optical elements within an electron-optical column includes one or more beam limiting apertures.

21. The system in claim 1, wherein an electron beam of the plurality of electron beams passes through and is directed by the one or more magnetic condenser lenses, then the one or more beam deflectors and the one or more electron-optical lenses, then the one or more magnetic focus lenses onto the surface of the sample.

22. The system in claim 1, wherein the one or more beam deflectors include one or more gun multipole beam deflectors.

23. The system in claim 22, wherein the one or more gun multipole beam deflectors include at least one of one or more gun quadrupole beam deflectors or one or more gun octupole beam deflectors.

24. The system in claim 1, wherein the one or more electron-optical lenses include one or more gun condenser lenses.

25. The system in claim 1, wherein the set of column electron-optical elements within an electron-optical column includes one or more anodes.

26. The system in claim 1, wherein the set of column electron-optical elements within an electron-optical column includes one or more electron detector assemblies.

27. The system in claim 26, wherein an electron detector assembly of the one or more electron detector assemblies comprises:
    a detector diode; and
    a detector shield.

28. The system in claim 26, wherein the one or more electron detector assemblies are bonded to a substrate array of the plurality of substrate arrays, wherein the substrate array includes amplifier circuitry electrically coupled to the one or more electron detector assemblies.

29. The system in claim 1, wherein the one or more beam deflectors include at least one of one or more upper beam deflectors and one or more lower beam deflectors.

30. The system in claim 1, wherein the one or more electron-optical lenses include one or more dynamic focus lenses.

31. The system in claim 1, wherein one or more column electron-optical elements of the set of column electron-optical elements are fully fabricated prior to being bonded to the plurality of substrate arrays.

32. The system in claim 1, wherein one or more column electron-optical elements of the set of column electron-optical elements are partially fabricated prior to being bonded to the plurality of substrate arrays, and fully fabricated after being bonded to the plurality of substrate arrays.

33. The system in claim 1, wherein the two or more electron-optical columns are individually adjustable.

34. The system in claim 1, wherein the set of column electron-optical elements are individually adjustable.

35. The system in claim 1, further comprising:
    a vacuum system, wherein the vacuum system comprises:
        a source region, wherein the source region houses the source assembly;
        a column region, wherein the column region houses the column assembly;
        a chamber region, wherein the chamber region houses the stage configured to secure a sample; and
        one or more vacuum pumps coupled to at least one of the source region, the column region, or the chamber region.

36. The system in claim 35, wherein one or more airways between the plurality of substrate arrays of the column assembly allow for a flow of gas between at least one of the layers of the column assembly, one or more portions of the column region, or one or more portions of the chamber region.

37. The system in claim 35, wherein the source region and the column region are separated by a set of conductance-limiting apertures.

* * * * *